United States Patent
Imai et al.

[11] Patent Number: 5,885,735
[45] Date of Patent: Mar. 23, 1999

[54] MASK HAVING A PHASE SHIFTER AND METHOD OF MANUFACTURING SAME

[75] Inventors: Akira Imai, Kokubunji; Norio Hasegawa, Tokyo; Hiroshi Fukuda, Kokubunji; Toshihiko Tanaka, Tokyo, all of Japan

[73] Assignee: Hitachi, Ltd., Tokyo, Japan

[21] Appl. No.: 834,542

[22] Filed: Mar. 31, 1997

Related U.S. Application Data

[62] Division of Ser. No. 282,543, Jul. 29, 1994, Pat. No. 5,656,397, which is a division of Ser. No. 593,808, Oct. 5, 1990, Pat. No. 5,362,591.

[30] Foreign Application Priority Data

| Oct. 9, 1989 | [JP] | Japan | 1-262157 |
| Dec. 26, 1989 | [JP] | Japan | 1-335061 |
| Mar. 9, 1990 | [JP] | Japan | 2-056353 |
| Apr. 2, 1990 | [JP] | Japan | 2-084836 |

[51] Int. Cl.$^6$ .................................................. G03F 9/00
[52] U.S. Cl. .............................................. 430/5; 430/322
[58] Field of Search ................................ 430/5, 322, 396

[56] References Cited

U.S. PATENT DOCUMENTS

| 4,190,759 | 2/1980 | Hongo et al. | 219/121 |
| 4,698,236 | 10/1987 | Kellogg et al. | 427/43.1 |
| 4,727,234 | 2/1988 | Oprysko et al. | 219/121 |
| 4,874,632 | 10/1989 | Nakagawa et al. | 427/41 |
| 4,902,530 | 2/1990 | Yasaka et al. | 427/38 |
| 5,035,787 | 7/1991 | Parker et al. | 204/192.34 |
| 5,045,417 | 9/1991 | Okamoto | 430/5 |
| 5,085,957 | 2/1992 | Hosono | 430/5 |
| 5,100,503 | 3/1992 | Allman et al. | 430/5 |
| 5,290,647 | 3/1994 | Miyazaki et al. | 430/5 |

*Primary Examiner*—S. Rosasco
*Attorney, Agent, or Firm*—Antonelli, Terry, Stout & Kraus, LLP

[57] ABSTRACT

There is disclosed a mask which includes a first phase shifter layer and a second phase shifter layer formed on the first phase shifter layer and has a structure capable of easily effecting highly precise control of the phase of exposure light and correction for a defect in the phase shifter layers. There are also disclosed a method of manufacturing the mask and a method of forming by use of the mask a pattern which has a smaller local error in pattern dimension and is free of a defect.

18 Claims, 23 Drawing Sheets

FIG. 18
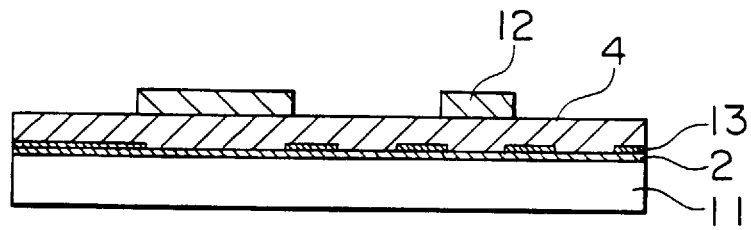
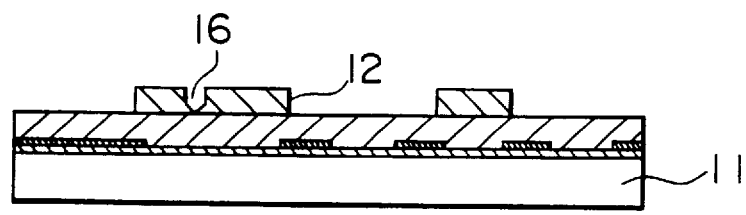
FIG. 19A
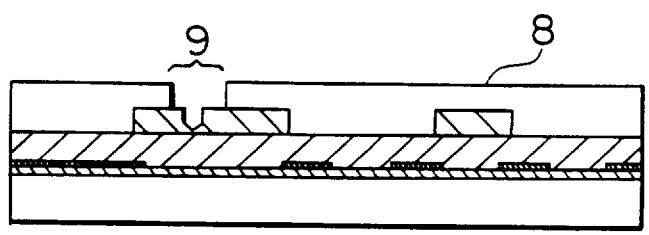
FIG. 19B
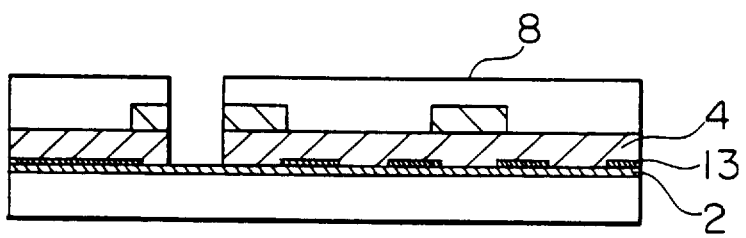
FIG. 19C
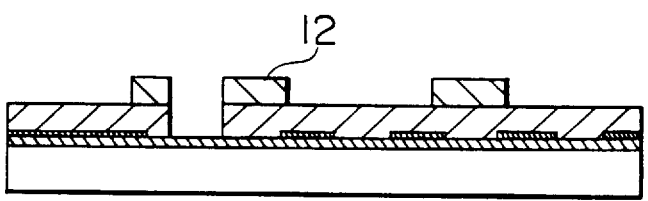
FIG. 19D FIG. 28
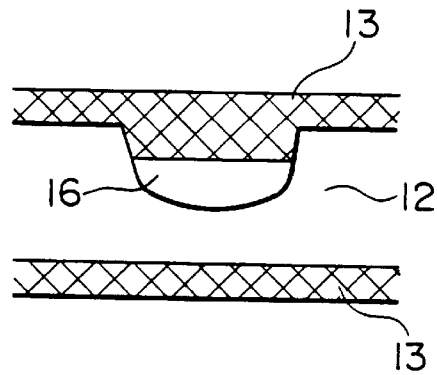
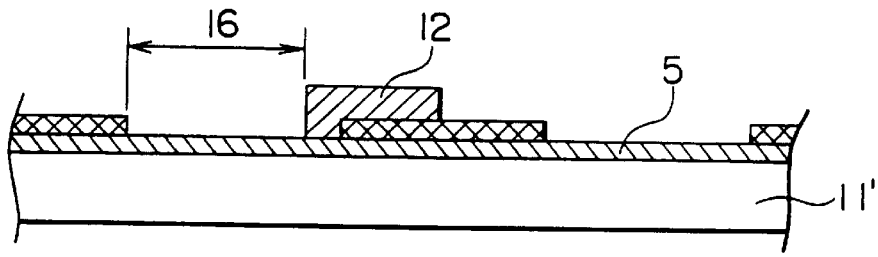
FIG. 29A
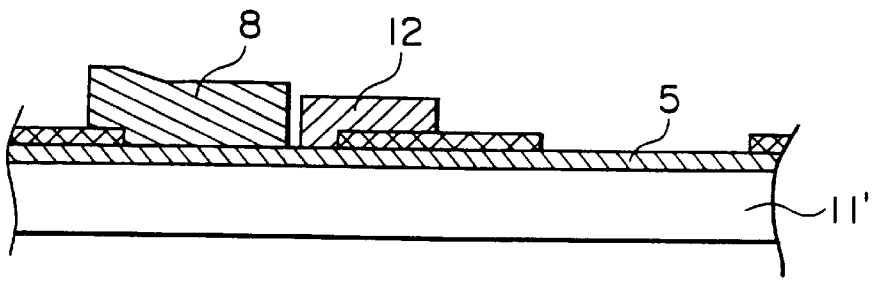
FIG. 29B
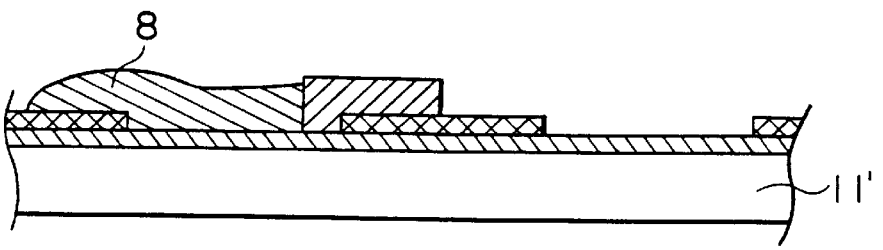
FIG. 29C

MASK HAVING A PHASE SHIFTER AND METHOD OF MANUFACTURING SAME

This application is a Divisional application of application Ser. No. 08/282,543, filed Jul. 29, 1994 now U.S. Pat. No. 5,656,307, which is a Divisional application of application Ser. No. 07/593,808 now U.S. Pat. No. 5,362,591, filed Oct. 5, 1990.

BACKGROUND OF THE INVENTION

The present invention relates to a mask with a phase shifter used for the formation of fine patterns in various solid state devices such as semiconductor devices, superconductor devices, magnetic devices, SAW devices and OEIC's (optoelectronic IC's), a method of manufacturing the mask and a method of forming a pattern by use of the mask.

Conventionally, the formation of fine patterns for solid state devices such as VLSI's has mainly been made by a reduction projection system. In the reduction projection system, an optical projection system is used to form an image of a mask pattern on a resist-coated substrate, thereby transferring the mask pattern. The resolution limit in the reduction projection system is proportional to an exposure wave length $\lambda$ and inversely proportional to a numerical aperture NA of the optical projection system. Accordingly, the improvement of the resolution has been promoted by shortening the exposure wave length and increasing the NA of a projection lens. However, the improvement of the resolution relying on this method is nearing a limit in the aspects of the design of the optical projection system, the manufacturing technique, the restriction on a light source, and so on.

On the other hand, as one method of overcoming such a limit exists a method (hereinafter referred to as a phase shifting method) in which the improvement of the resolution and the increase of the depth of focus are intended by introducing a phase shift between lights passed through adjacent transparent portions on a mask. According to this method, for example, in the case of a repeating pattern of elongated transparent and opaque areas, transparent materials (hereinafter referred to as phase shifters) for introducing a phase shift are provided for every other transparent area so that a phase shift between lights passed through adjacent transparent areas on the mask becomes substantially 180°. JP-A-58-173744 (corresponding to U.S. Ser. No. 365,672 filed on Apr. 5, 1982) and IEEE, Trans. Electron Devices, ED 29, No. 12 (1982), pp.1828–1836 have disclosed that the resolution in the case of the above pattern is improved by about 40% as compared with a method in which no phase shifter is provided.

A resist material and a spin on glass (SOG) material are known as a material which forms the phase shifter. The resist material has a demerit that the mechanical durability thereof is weak.

A mask manufacturing method in the case where the SOG material is used as the phase shifter forming material, includes a step of forming an antistatic layer or film of indium tin oxide on a glass plate substrate, a step of forming a chromium film of a predetermined configuration on the antistatic layer, a step of thereafter spin-coating an SOG film on the substrate, a step of forming a resist film of a predetermined configuration on the SOG film and a step of etching the exposed SOG film.

In the above prior art, the phase shifter consists of one layer. Therefore, especially when the phase shifter layer is formed by a spin coat film, the fluctuations of thickness of the spin coat film caused by the unevenness of the underlying substrate give rise to trouble. An opaque or light shielding film used in a usual mask includes a Cr film and has a film thickness of about 80 nm. This film is disposed with a variety of configurations and pattern densities. When a phase shifter layer of a spin coat film is formed on the Cr film, the phase shifter layer surrounded by the Cr film is formed with a film thickness which is larger by the thickness of the Cr film as compared with the thickness of the spin coat film. However, in the case where the most of the underlying substrate is occupied by a transparent portion and hence the Cr film is formed over a small area, the phase shifter layer is formed with a film thickness which is substantially the same as the thickness of the spin coat film. For example, in the case where a fine pattern of Cr film is repeatedly arranged beside a large pattern of Cr film, the film thickness of the phase shifter layer on the transparent portion beside the large pattern of Cr film is larger by about 80 nm than the thickness of the spin coat film but the film thickness of a portion of the phase shifter layer apart from the large pattern of Cr film is near the thickness of the spin coat film. Thus, a macroscopical thickness distribution is developed in the mask. Accordingly, the film thickness of the phase shifter layer has the fluctuations which may locally amount to about 80 nm. Even if the phase shifter layer is preliminarily spin-coated with a small thickness of 40 nm with consideration for such an error in film thickness, the fluctuations of 40 nm cannot be prevented. The phase shifter film thickness to be set is different depending upon the refractive index of the film. For example, in the case where the exposure wave length is about 365 nm and the refractive index of the film is 1.45, the optimum film thickness for the phase shifter layer is about 406 nm and hence the error of 40 nm amounts to about 10%. The version of this film thickness error calculated in terms of a phase shift assumes an error of about 20° which may greatly affect the pattern resolution.

Also, the above prior art has a problem that the method can be applied to only a certain specified pattern configuration such as the repeating arrangement of transparent and opaque areas. Further, in the above prior art, a plurality of transparent areas between which the phase shift of 180° is introduced must be separated from each other. In the case where such a separated pattern is to be formed, there is a problem that a negative tone resist material must be used or it is difficult to use a positive tone resist material which is mainly used in the existing LSI fabrication process.

Furthermore, in the above prior art, there is an intricate problem that a resist material must be used for delineating the spin on glass layer.

Moreover, when a phase shifting mask is fabricated by virtue of the above prior art, the following problem is encountered in (1) the case where a phase shifter is not formed in a predetermined area by the phase shifting mask or the phase shifter has a deficiency, (2) the case where a phase shifter is formed outside a predetermined area and is left or (3) the case where the film thickness or the like of a phase shifter is different from a desired value though the phase shifter is formed at a predetermined location. Namely, the whole of the defective phase shifter should be removed and a new phase shifter should be thereinstead formed again or a new mask should be fabricated again from the beginning, which requires labors and a time.

U.S. Ser. No. 418,525 filed on Oct. 10, 1989 and assigned to the assignee of the present application has disclosed the detection of a defect in a photomask in which the defect is detected on the basis of the intensities of the transmitted version and/or reflected version of light with which the mask having the phase shifter is irradiated.

SUMMARY OF THE INVENTION

A first object of the present invention is to provide a method of manufacturing a mask having a phase shifter which can control the phase of exposure light with a high precision without being affected by the presence of a light shielding film.

A second object of the present invention is to provide a method of manufacturing a mask with which the contrast of an optical projected image of a transfer pattern which is not limited to a specified pattern such as a line/space pattern and may take a variety of configurations can be improved, thereby making it possible to delineate or form a well-defined pattern.

A third object of the present invention is to provide a method of manufacturing a mask having a phase shifter which is formed by delineating a spin on glass film without using any resist material.

A fourth object of the present invention is to provide a mask having a structure which makes it possible to easily correct a defect in a phase shifter and to provide a mask manufacturing method which includes a defect correcting step.

Another object of the present invention is to provide a pattern forming method in which a fine pattern free of a defect and with a smaller error in dimension is formed by use of the mask manufactured by the above-mentioned manufacturing method.

To achieve the first object, in the present invention, a phase shifter is formed on a flat surface. Especially, in the case where a light shielding film having a predetermined configuration is formed on a glass plate substrate, the formation of the light shielding film on the glass plate substrate is followed by the provision of a planarization layer for smoothing the evenness of the light shielding film and a phase shifter is formed on the planarization layer.

In order to obtain a satisfactory effect of the phase shifting method, it is necessary to suppress an error in phase to a value not larger than about 10°. By providing the planarization layer under the phase shifter, it is possible to prevent the fluctuations of the film thickness of the phase shifter at portions where the dimension or density of the light shielding pattern is different. Though the planarization layer has the fluctuations of the film thickness, like the phase shifter, the fluctuations are macroscopical and no problem arises so long as the film thickness of the phase shifter layer formed on the planarization layer involves no variation. The planarization layer also serves as an auxiliary phase shifter layer for recovering a defect in the phase shifter.

To achieve the second object, a method of the present invention includes a step of directly forming an end portion of a phase shifter with a desired configuration on a flat glass plate substrate which is transparent to light.

FIG. 1A shows the cross section of a part of a mask having two transparent areas (hereinafter referred to as first and second transparent areas) which respectively transmit lights therethrough with a phase shift of 180°, FIG. 1B shows the phase of light transmitted through the mask at an adjoining portion where the two transparent areas directly adjoin each other, and FIG. 1C shows the intensity of projected exposure light on a focal plane. The first transparent area includes a substrate 11 and the second transparent area includes a laminated structure of the substrate 11 and a phase shifter 12. It is seen that the phases of lights transmitted through the two transparent areas are cancelled from each other at a boundary portion between the two areas so that the light intensity is remarkably weakened. This principle can be applied to various mask patterns which will be mentioned hereinbelow.

FIG. 2A shows the cross section of a mask in the case where phase shifters having a small width are provided on opposite sides of an opaque area of a line/space pattern, FIG. 2B shows the phase of light immediately after having been passed through the mask, and FIG. 2C shows the intensity of light on a substrate. Also, FIG. 3A shows the cross section of the conventional type mask which is provided with no phase shifter and FIGS. 3B and 3C show the phase of light and the intensity of light which correspond to FIGS. 2B and 2C, respectively. From the comparison of FIGS. 2A, 2B and 2C with FIGS. 3A, 3B and 3C, it is understood that a satisfactory optical image having a higher contrast can be obtained in the line/space pattern by providing the phase shifter with a small width at the boundary between the transparent and opaque areas of the mask. This method can be applied to a pattern having any configuration. Therefore, there is no restriction on a resist process, a pattern layout and so on. The above effect is also observed at a position where the substrate is deviated from an in-focus level in a direction of the optical axis.

FIG. 4A shows the cross section of a mask in the case where a stripe-shaped phase shifter having a width not larger than $\lambda$/NA is arranged in a transparent area, FIG. 4B shows the phase of light immediately after having been passed through the mask, and FIG. 4C shows the intensity of light on a focal plane. Also, FIGS. 5A, 5B and 5C are views similar to FIGS. 4A, 4B and 4C in the case where not a phase shifter but a stripe-shaped opaque area having the same width as the phase shifter of FIGS. 4A, 4B and 4C is disposed in a transparent area. Notwithstanding that the mask is formed by only the transparent areas, as shown in FIG. 4A, it is apparent from FIG. 4B that the second transparent area introducing a phase shift provides a light shielding effect similar to that in the case where it is an opaque area. Further, the mask according to the present invention provides a stronger light shielding effect, as apparent from FIG. 5C, though in the conventional type mask shown in FIG. 5A the intensity of light at the light shielding portion on the focal plane does not completely become 0. Accordingly, by using the mask according to the present invention, a satisfactory optical image having a high contrast can be obtained for any line-shaped pattern.

FIG. 6A shows the cross section of a mask in the case where stripe-shaped phase shifters having a size larger than a resolution limit are periodically arranged in a transparent area, FIG. 6B shows the phase of light immediately after having been passed through the mask, and FIG. 6C shows the intensity of light on a focal plane. Notwithstanding that no opaque area is present in the vicinity of a boundary portion between the first transparent area and the second transparent area, as shown in FIG. 6A, it is seen from FIG. 6C that the intensity of light at the boundary portion becomes zero. Namely, the boundary between the first and second transparent areas can be used as a light shielding pattern. In this case, it is seen from FIG. 6C that the period of light intensity on the focal plane is two times as high as the period of the mask pattern. Accordingly, it is possible to form a very fine line/space pattern.

All of the above effects are originated from the fact that the phase of light passed through the first transparent area and the phase of light passed through the second transparent area as a phase shifter are cancelled from each other so that the light intensity is remarkably weakened.

To achieve the third object, in the present invention, a pattern is formed by a step of forming a spin on glass layer by spin-coating a spin on glass material which mainly contains silanol compound, a step of exposing the spin on glass layer to a charged particle beam or laser light in a predetermined pattern configuration to write or delineate a pattern and a step of developing the spin on glass layer.

FIG. 7 is a flow chart-showing an example of a pattern forming method of the present invention. First, there is conducted a step 101 of forming a spin on glass layer by coating a substrate with a spin on glass material. Generally, the spin on glass material includes a silanol compound (or a mono hydroxy derivative of silane) and a solvent (such as methanol). The spin on glass material may further include another component, depending upon the kind of the spin on glass material. The coating of the substrate with the spin on glass material is followed by a baking step 102 of evaporating the solvent. For example, in the case where the main component of the solvent is methanol, a baking process at a temperature (for example, 80° C.) higher than a boiling point of 64.7° C. under the atmospheric pressure for about 15 minutes makes it possible to evaporate and remove the most of the solvent. In general, since the solvent has a volatility, the baking step 102 may be conducted at a temperature lower than the boiling point or the substrate coated with the spin on glass material may be left as it is without being subjected to the baking step 102. As the solvent evaporates, the condensation reaction of silanol groups of the silanol compound makes progress so that the spin on glass layer becomes hard to dissolve in an organic solvent. Therefore, it is not very preferable that the baking temperature is not lower than 150° C. or the baking time is not shorter than 30 minutes. Similarly, it is not very preferable that the substrate is left as it is for a long time after having been coated. Thereafter, for example, a step 103 of making direct EB (electron beam) writing using an EB direct writing system is conducted. Since the silanol compound has a sensitivity to an electron beam or ultra-violet rays, the condensation reaction of silanol groups of the silanol compound makes progress through exposure to the electron beam or ultra-violet rays. Also, since the temperature of the spin on glass layer in an area exposed to the electron beam is instantaneously raised up to a value not lower than 150° C. upon exposure to the electron beam, there is obtained the same effect as the case where a baking process is conducted to the spin on glass layer in an area to be exposed. Therefore, the condensation reaction further proceeds and the spin on glass layer in the exposed area becomes insoluble in an organic solvent. Accordingly, when a process 104 for development through immersion in an organic solvent such as methanol or acetone is conducted after exposure to a pattern, the spin on glass layer on an unexposed area is removed, thereby obtaining a delineated pattern.

FIG. 8 shows the EB sensitivity curve of OCD Type 7 (manufactured by Tokyo Ohka Kogyo Co.) which is one of spin on glass materials. In FIG. 8, the abscissa represents the electron beam (EB) dosage ($\mu C/cm^2$) and the ordinate represents a normalized film thickness (%) which is the ratio of the film thickness of the spin on glass layer after development to the film thickness thereof before development. Since the spin on glass material is negative to an electron beam, a pattern is formed after development if an EB dosage not smaller than 40 $\mu C/cm^2$, for example, 50 $\mu C/cm^2$ or more than that is employed at an acceleration voltage of 30 kV. When the controllability of the film thickness is taken into consideration, it is preferable that the EB exposure is made with an EB dosage not smaller than 200 $\mu C/cm^2$ at which the value of the thickness of the spin on glass film involves almost no variation attendant upon a change in EB dosage.

The total exposure energy ($J/cm^2$) of the electron beam in this case is represented by the product of the acceleration voltage and the EB dosage (or exposure dosage). The total exposure energies at the acceleration voltage of 30 keV are 1.2 $J/cm^2$, 1.5 $J/cm^2$ and 6 $J/cm^2$ in the case where the EB dosages are 40 $\mu C/cm^2$, 50 $\mu C/cm^2$ and 200 $\mu C/cm^2$, respectively.

In order to suppress thermal diffusion upon EB exposure, it is preferable that the maximum shot size in the case of the acceleration voltage of 30 kV and the current density of 5 $A/cm^2$ by way of example is not larger than 2 $\mu m \times 2 \mu m$. For the similar reason, it is not very preferable that the same area is exposed to the electron beam continuously over a time not shorter than 1 ms. Also, since continuous exposure of neighboring areas causes the accumulation and diffusion of heat so that the above-mentioned condensation reaction may make progress even in an area not to be exposed, thereby making it hard to resolve the pattern, it is not very preferable that the neighboring areas are continuously exposed. Means for causing instantaneous thermal raising, for example, laser light or an ion beam may be used instead of the EB exposure.

The durability of the pattern thus formed is not very high since the above-mentioned condensation reaction does not progress sufficiently. Therefore, a step 105 for a baking process at a temperature not lower than 150° C. is conducted in order to proceed with the condensation reaction for glass transition and increased denseness. In general, the spin on glass layer is brought into glass transition through a baking process at a temperature of 200° C. to 350° C. for about 30 minutes. If it is necessary to further improve the durability, a baking process is thereafter conducted, for example, at a temperature of about 450° C. for about 30 minutes, thereby obtaining increased denseness. By conducting the baking step 105 as mentioned above, the pattern becomes hard, for example, with the Mohs' scale equal to or larger than 2 and the durability is remarkably improved. If the baking temperature is increased to a value not lower than about 500° C., there may be the case where a crack is produced in the spin on glass layer. Therefore, it is not preferable that the temperature is too high. It is needless to say that the condition of the baking step 105 changes depending upon the kind of the spin on glass material and so on.

When the developing step 104 is conducted by use of the organic solvent, as mentioned above, there may be the case where components including the silanol compound separate again after the evaporation of the organic solvent so that the residue of the spin on glass material is left in an area which is not exposed. In this case, the residue has the component substantially identical to the delineated portion and the amount of the residue is usually very little. Therefore, if a spin on glass film thickness adjusting step 106 of removing a small amount of the residue component by use of a chemical reaction is conducted after the developing step 104, as shown in FIG. 9, the residue component can be removed and the most of the delineated portion can be left, thereby obtaining a desired pattern. Alternatively, the step 106 of removing the residue component may be conducted after the baking step 105, as shown in FIG. 10. Though it may be considered that the thickness of the spin on glass film after the step 104 or step 105 is larger than a desired value, the adjustment of the film thickness of the pattern is possible also in this case by conducting the step 106 as shown in FIG. 9 or 10. For the step 106 are present various methods such as etching by wet process which uses a hydrofluoric acid-base etchant or etching by dry process which uses a gas such as $CF_4$. If the suppression of a dimensional variation of the pattern is taken into consideration, it is preferable that an anisotropic dry etching process is used to effect the etching of a small amount in a film thickness direction.

By properly selecting the condition of the EB exposure step 103, it is also possible to adjust the film thickness of the pattern after the developing step 104 has been conducted. This is because the solubility of the spin on glass layer in the area to be exposed for the organic solvent can be changed by properly selecting the maximum shot size or the total exposure energy upon EB exposure. It is needless to say that the conditions of the total exposure energy, etc. may change depending upon the kind of a spin-coated material, the thickness of a spin coat film layer and a material of the underlying substrate of the film layer.

By using the pattern delineation process as mentioned above, for example, a tri-layer resist scheme using a spin on glass film for a middle layer can be replaced by a bi-layer exist scheme in which the uppermost resist layer is not necessary. Also, the pattern delineation process can be utilized for the fabrication of a so-called phase shifting mask used in, for example, a projection printing system in which a KrF excimer laser (wave length 248 nm) or i-line (wave length 365 nm) of a high-pressure Hg lamp is used as a light source. Namely, if a spin on glass film providing the transmissivity not lower than 90% for light of wavelengths between 240 nm and 400 nm is used as a phase shifter, it is possible to form a phase shifter pattern by directly delineating the spin on glass film without using any resist material. Further, since it is easy to control the thickness of the phase shifter film by properly selecting the total EB exposure energy, as mentioned above, it is also possible to arbitrarily adjust the thickness of the phase shifter film in any area of one phase shifting mask. Also, since the development is conducted by use of an organic solvent or an aqueous base alkaline developer, it is not necessarily required that a film serving as an etching stopper is provided when the phase shifter film is to be etched. Moreover, since the electron beam exhibits sufficient transmission through the spin on glass film to cause the condensation reaction which is substantially uniform in the film thickness direction, an end portion of the cross section of a formed pattern is substantially perpendicular to the mask substrate surface. Accordingly, in the case where the phase shifter pattern is directly disposed in a transparent area of the mask, a phase shift between exposure light passed through an area where the phase shifter is provided and exposure light passed through an area where no phase shifter is provided can be abruptly changed at the end portion of the pattern.

The above method can be also applied to a phase shifter pattern defect correcting method, thereby easily correcting a defect in the phase shifter pattern.

To achieve the above-mentioned fourth object, in the present invention, a transparent material lying under a phase shifter at a deficient portion of a phase shifter pattern is selectively etched so that a phase shift between exposure light passed through the portion where the phase shifter is deficient and exposure light passed through a transparent area where the phase shifter is not deficient becomes substantially 360°. The deficiency includes the case where the phase shifter material is missing and thin and the case where the thickness of the phase shifter material film is different from a desired value.

To achieve the above object, in the present invention, a material which is transparent to exposure light is selectively deposited or pattern-wise formed on an area inclusive of the above-mentioned deficient portion with a thickness with which a phase shift between exposure light passed through the deficient portion and exposure light passed through a phase shifter portion becomes substantially zero. Preferably, a baking process is additionally conducted.

To achieve the above object, in the present invention, after the whole of a phase shifter pattern including the above-mentioned deficient portion has been removed, a material which is transparent to exposure light is pattern-wise formed with a thickness with which a phase shift between exposure light passed through the deficient portion and exposure light passed through a transparent area where a phase shifter is not deficient becomes substantially zero.

To achieve the above object, in the present invention, in the case where a phase shifter involves a fine deficiency, a material which is opaque to exposure light is selectively deposited on the deficient portion.

To achieve the above object, in the present invention, an unnecessary residue portion of a phase shifter is selectively exposed to a particle beam or laser light to selectively remove the residue portion.

To achieve the above object, in the present invention, means for detecting a defect portion of a phase shifter and storing the position and size of the defect portion is provided to correct a defect in a mask by use of information of the detected defect portion concerning the position and size.

To achieve the above object, in the present invention, a material with a predetermined thickness which is transparent to exposure light is provided under the phase shifter pattern.

The inferiors of a phase shifting mask include ①  the deficiency of a chromium pattern, ②  the residue of a chromium film, ③ a defect in a phase shifter, ④ the residue of a phase shifter, ⑤ alien substances on an opening pattern and ⑥ alien substances on a phase shifter. The conventional mask correcting method may sufficiently cope with the inferiors ① and ②. The alien substances of the inferiors ⑤ and ⑥ can be removed by cleaning the mask. The inferiors ③ and ④ are peculiar to the phase shifting mask. The residue of the inferior ④ can be removed by selectively etching the phase shifter again. In the case where the residue of the phase shifter has a dimension smaller than the resolution limit, it is not necessary to particularly remove the residue. On the other hand, the phase shifter defect of the inferior ③ cannot simply be corrected.

FIG. 11 shows a flow chart of a mask defect inspecting/correcting method which is an embodiment of the present invention. A phase shifting mask is inspected by a predetermined inspection method and information concerning the position and size of any defect in a phase shifter is stored in the case where the defect is present (step 201 in FIG. 11). Next, the defective mask is coated with a resist material and a predetermined resist pattern is delineated by selectively exposing and developing the resist material by use of the above information so that the defect portion is exposed (step 202 in FIG. 11). The exposure includes charged particle beam exposure using an EB direct writing system or the like and EB exposure is particularly preferable. It is ideal that the resist film can be formed with a pattern which causes the defect portion to exactly expose. Actually, however, since a deviation occurs upon exposure, it is very difficult to form such an ideal pattern. Therefore, a resist film having a predetermined configuration is formed by making exposure and development so that the whole of the defect portion is exposed even if the deviation occurs. If this resist film is used as a mask to selectively etch away the exposed portion of the phase shifter, the resulting structure is substantially equivalent to a structure in which only the defect portion of the phase shifter is substantially exposed (step 203 in FIG.

11). Thereafter, a transparent material lying under the phase shifter exposed in the relevant area is etched by a predetermined depth so that a phase shift between light passed through that area and light passed through an area where the phase shifter is provided becomes 360° (step 204 in FIG. 11). Alternatively, a transparent material film having the substantially same thickness as the above predetermined depth may be preliminarily provided as the underlying transparent material and this film is to be selectively etched. As a result, light passed through the defect-corrected transparent area and light passed through the intrinsic transparent area can be handled as lights which have the same phase. Accordingly, the defect of the phase shifter can be corrected. In order to provide an abrupt change of 360° in phase between the defective portion and the non-defective portion, it is preferable that the above-mentioned etching is made by an anisotropic dry etching process.

In FIG. 12, after the mask has been inspected, a second phase shifter film is selectively deposited on a defective portion where the phase shifter is deficient (step 205 in FIG. 12). In order to deposit the phase shifter film, a material to be deposited may be evaporated by an evaporation method so that it is beam-wise incident upon the defective portion of the phase shifter. Alternatively, the selective deposition may be effected by a beam-excited CVD using a focused ion beam, laser light or the like. In the case of FIG. 12, if the phase shifter depositing step is conducted in succession to the detection of the defect in the phase shifter, the working process and the working time can be further shortened.

In FIG. 13, a second phase shifter film is formed on the phase shifting mask after inspection and a resist film having a predetermined pattern is formed on the second phase shifter film (step 206 in FIG. 13). And, the resist film is used as a mask to selectively etch the second phase shifter film so that a second phase shifter having a desired configuration is formed on a defective portion which includes a deficiency (step 207 in FIG. 13).

In FIG. 14, a resist material itself is used as a phase shifter (step 209 in FIG. 14) instead of using the second phase shifter as shown in FIG. 13. In this case, the working process can be more simplified in comparison with the above-mentioned method.

In the cases of FIGS. 12, 13 and 14, it is difficult to form the second phase shifter on the defective portion in accurate coincidence therewith. Therefore, after the second phase shifter for defect correction has been formed, the phase shifter pattern for defect correction is subjected to slight thermal flow at a temperature at which the second phase shifter film has a fluidity (step 208 in FIG. 13 and step 208 in FIG. 14). Thereby, the defect portion is completely filled with the material of the second phase shifter film and the surface of the second phase is planarized. Accordingly, the deviation of the second phase shifter pattern formed on the defect portion can be easily corrected so that the defect of the phase shifter is corrected.

In FIG. 15, after the whole of a phase shifter pattern including the detected phase shifter defect has selectively been removed, a new phase shifter pattern is delineated in place of the removed phase shifter pattern. In this case, the problem of the deviation of a phase shifter pattern as mentioned above does not occur.

In the case where the size of the defect of a phase shifter is very small, the following method may be used. In the case where a deficient defect portion 16 of a phase shifter 12 is very small, as shown in FIG. 16A illustrating the cross section of a mask, the intensity of exposure light passed through the mask on a focal plane decreases at a position corresponding to the defect portion 16, as shown in FIG. 16B. By merely depositing a layer 13' opaque to exposure light or exposure wave length, as shown in FIG. 16C, instead of correcting the phase shifter at the defective portion, the decrease in light intensity almost disappears so that the influence of the defect is appreciably reduced, as shown in FIG. 16D.

FIG. 17 shows a flow chart of a method of correction for a residue defect of a phase shifter on a mark. The mask is inspected by a predetermined inspection method and information concerning the position and size of the residue of the phase shifter is stored in the case where the residue is present (step 201 in FIG. 17). Next, the residue portion is selectively exposed to a particle beam or laser light by use of the above information so that the phase shifter is evaporated. By exposing the residue of the phase shifter until the whole of the residue is substantially evaporated, it is possible to remove the residue of the phase shifter (step 210 in FIG. 17). Accordingly, it is possible to correct the defect of the phase shifter. In the case of FIG. 17, if the residue of the phase shifter is removed in succession to the detection of the residue of the phase shifter, the working process and the working time can be shortened. Also, if the defect correction process shown in FIG. 17 is used in combination with the defect correction process shown in FIG. 12, the correction for the deficiency defect and the correction for the residue defect can be made in parallel with each other, thereby making it possible to further shorten the working process and the working time.

As apparent from the foregoing, the inspection of and the correction for a defect in a phase shifter can be made with high efficiency by use of the present invention.

The above and other objects and many of the attendant advantages of the present invention will be readily appreciated as the same becomes better understood by reference to the following detailed description when considered in connection with the accompanying drawings.

BRIEF DESCRIPTION OF THE DRAWINGS

FIG. 18 is a schematic cross section of a phase shifting mask in which a planarization layer is provided.

FIGS. 19A to 19D are schematic cross sections showing steps for correction of a defect in a phase shifter.

FIG. 28 is a plan view of a phase shifter having a defect.

FIGS. 29A to 29C and 30A to 30D are cross sections showing steps for correction of defects in phase shifters.

DETAILED DESCRIPTION OF THE INVENTION

Figure 1A:
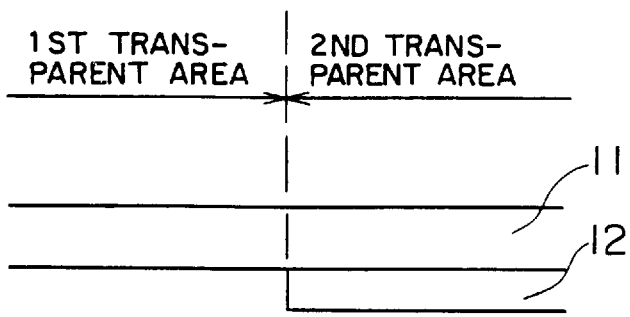
FIGS. 1A, 2A, 4A and 6A are schematic cross sections of masks having phase shifters.
Figure 1B:
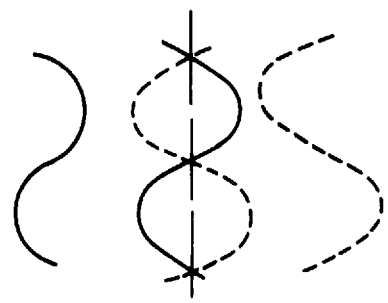
FIGS. 1B, 2B, 3B, 4B, 5B and 6B are views showing the phase of light immediately after having been passed through a mask.
Figure 1C:
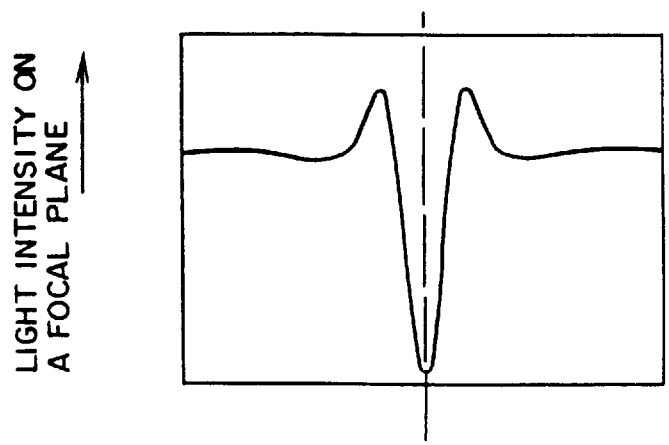
FIGS. 1C, 2C, 3C, 4C, 5C and 6C are graphs showing the intensity of exposure light on a focal plane.

The present invention will now be explained by virtue of embodiments.

Embodiment 1

An embodiment according to the present invention will be explained by use of FIG. 18. As shown in FIG. 18, a conducting film or a transparent antistatic film 2 such as ITO (indium tin oxide), etc. and a chromium film were successively laminated on a glass substrate 11 and a chromium film 13 having a predetermined pattern was thereafter formed through a known process. The chromium film 13 is used as a light shielding film. A film of a material which is opaque to exposure light, for example, molybdenum silicide may be used in place of the chromium film 13. Next, a first silicon compound coat layer 4 was deposited on the entire surface. In the present embodiment, OCD Type 7 T-11000 (product name by Tokyo Ohka Kogyo Co.) was used for the first silicon compound coat layer 4. However, without limiting to this material may be used another material so long as it provides the transmissivity not lower than about 80% at an exposure wave length used in an optical projection system used. Also, the film thickness of the first silicon compound coat layer 4 was about 430 nm. Provided that this film thickness is $t$, the exposure wave length is $\lambda$ and the refractive index of the film at the exposure wave length $\lambda$ is $n$, the film thickness $t$ was set to satisfy the relation of $$t=\lambda/\{a(n-1)\}$$

(where $1.3 \leq a \leq 4$). This relation corresponds to the condition of a phase shifter. The optimum value for the film thickness $t$ is given in the case where $a$ is equal to 2 in the above equation. In the case of the present embodiment, the optimum film thickness value is about 430 nm since the exposure wave length $\lambda$ is 365 nm and the refractive index of the first silicon compound coat layer 4 at this exposure wave length is 1.43.

Next, a baking process at 200° C. for 20 minutes was conducted to cure the first silicon compound coat layer 4. The temperature and time for this baking process are selected so as to prevent the first silicon compound coat layer from being dissolved or decomposed upon subsequent film formation but are not limited to the shown condition. In the case of the OCD Type 7 T-11000 used in the present embodiment, it is preferable that the baking temperature is not lower than 120° C.

Next, a second silicon compound coat layer was deposited on the entire surface. In the present embodiment, the OCD Type 7 T-11000 (product name by Tokyo Ohka Kogyo Co.) was used for the second silicon compound coat layer. However, without limiting to this material may be used another material so long as it provides the transmissivity not lower than about 80% at an exposure wave length used in the optical projection system used. Also, the condition for the film thickness of the second silicon compound coat layer is the same as the condition for the film thickness of the first silicon compound coat layer 4. Thereafter, a baking process at 80° C. for 10 minutes was conducted. This baking process can be omitted.

Next, a predetermined phase shifter pattern was written or delineated in the second silicon compound coat layer by direct EB writing which uses an EB direct writing system (acceleration voltage of 30 kV). In the present embodiment, the EB dosage was about 200 $\mu$C/cm$^2$. The EB dosage is not limited to the shown value and the optimum value for the EB dosage changes depending upon the acceleration voltage of the EB direct writing system used, the material of the second silicon compound coat layer, the conditions of baking process, the dimensions of a pattern to be delineated, and so on. In the present embodiment, an electron beam was used for pattern delineation. However, the pattern delineation is not limited to the use of the electron beam. For example, laser light or an ion beam may be used. Next, the second silicon compound coat layer was developed by methanol for 3 minutes to form a phase shifter 12. The developer (solution) is not limited to methanol and another material may be used so long as it can remove an area which is not exposed to the electron beam, leaving an area which is exposed to the electron beam. Next, a baking process at 200° C. for 20 minutes was conducted to cure the phase shifter. The conditions for the baking process are not limited to the shown conditions and there may be employed conditions under which a resistance against the cleaning of the mask and so on is obtainable.

In the case where the parameter $a$ of the equation for determining the film thickness $t$ of the second silicon compound coat layer falls outside the range of $1.3 \leq a \leq 4$, the transferred pattern was not clearly resolved. Especially, when a focal plane level upon exposure differs from the optimum value, the inferiority in resolution was remarkable. Also in the case where the film thickness $t$ of the first or second silicon compound coat layer satisfies $$t=\lambda/(n-1)\times\{(1/a)+m\}$$

(where $m$ is an integer which is not negative), a satisfactory result was obtained like the above-mentioned embodiment.

By the process as mentioned above, it was possible to simply manufacture a phase shifting mask which has a high precision.

As the result of defect inspection conducted for the phase shifting mask manufactured as mentioned above, a defect was found in the phase shifter. Therefore, the defect correction was conducted. In the defect inspection, the phase shifting mask was exposed to light from the phase shifter side thereof, the intensity of reflected light was detected and the comparison with design data was made by use of a computer to judge whether or not a shifter pattern edge is present.

An embodiment of the correction of a defect in a phase shifter according to the present invention will be explained by use of FIGS. 19A to 19D. As shown in FIG. 19A, a phase shifter 12 of a phase shifting mask was provided with a defect portion 16 where the phase shifter film is deficient. Therefore, a positive tone EB resist material OEBR 2000 (product name by Tokyo Ohka Kogyo Co.) was first deposited on the entire surface of the mask, as shown in FIG. 19B. Though in the present embodiment the OEBR 2000 (product name by Tokyo Ohka Kogyo Co.) was used as the positive tone EB resist material, another resist material may be used. Next, pattern delineation and development were conducted using a known EB direct writing system to remove the positive tone EB resist material in an area 9 which includes the defect portion 16. Next, as shown in FIG. 19C, the positive tone EB resist film 8 was used as a mask to etch away the phase shifter 12 which includes the defect portion 16 and a first silicon compound coat layer 4 which lies just under the phase shifter 12. In the present embodiment, the etching was made using an etchant which includes the mixture of hydrofluoric acid and ammonium fluoride at the ratio of 1:20. In this case, the first silicon compound coat layer 4 and the phase shifter 12 were the same material and had the substantially same etching rate for the above etchant since they had encountered the baking processes at the same temperature. Also, since the antistatic film 2 serves as an etching stopper film, there is no fear that the glass substrate 11 may be etched. The etchant is not limited to the above-mentioned solution. Though in the present embodiment the wet etching process was used, it is needless to say that the invention is not limited to this or a dry etching process such as a reactive ion etching process is applicable. Next, the positive tone EB resist film 8 was removed by a known method, thereby fabricating a defect-corrected mask as shown in FIG. 19D.

As the result of pattern transfer experiments using the mask (or phase shifting mask) having a phase shifter manufactured as mentioned above, a satisfactory pattern was transferred with no transfer of the phase shifter pattern defect which had been found before the defect correction. The normal effect of a phase shifting method was obtained and the effect of the improvement in resolution was confirmed.

In the present embodiment, the antistatic layer 2 was disposed on the glass substrate 11. This film 2 not only has a function of preventing the mask from being antistatically charged up when a predetermined mask pattern is EB exposed but also serves as an etching stopper, as mentioned above. Accordingly, in the case where the charge-up of the mask is prevented by another means, a material other than the antistatic film can be used. For example, a silicon nitride film can be used as an etching stopper.

Semiconductor devices were manufactured using the phase shifting mask manufactured as mentioned above. As a result, it was possible to resolve a fine pattern which could not be resolved by the conventional type mask. Further, there was obtained a uniform pattern dimension precision having a little influence of the in-plane in-focus level distribution of a projected image which is a characteristic of a reduction projection exposure system. Especially, since a local error in dimension of the phase shifter depending upon the presence/absence of the chromium film 13 can be made small, well-balanced device characteristics free of variations were obtained.

Embodiment 2

In the embodiment 1, a pattern was formed by directly exposing the second silicon compound coat layer to an electron beam. In the present embodiment, however, a phase shifter 12 having a predetermined pattern was formed by using a resist material as a mask to etch the second silicon compound coat layer. Steps until the deposition of the second silicon compound coat layer were the same as those in the embodiment 1. Next, a baking process at 90° C. for 20 minutes was conducted. Thereafter, the resultant structure was coated with an EB resist material and a predetermined pattern for phase shifter made of an EB resist film was formed using a known EB direct writing system. Next, the second silicon compound coat layer was etched with the EB resist film being used as a mask. An etchant used was a solution which includes the mixture of hydrofluoric acid and ammonium fluoride at the ratio of 1:20. At this time, the etching rate of the second silicon compound coat layer was about four times as high as the etching rate of the first silicon compound coat layer 4 which lies under the second silicon compound coat layer. By virtue of this difference in etching rate, the second silicon compound coat layer was selectively etched. At this time, the etching depth of the first silicon compound coat layer 4 was not larger than about 10 nm. Next, the resist film was removed and a baking process at 200° C. for 20 minutes was conducted, thereby curing the second silicon compound coat layer to form the phase shifter 12.

A desired phase shifting mask was manufactured through the above steps. However, since the first silicon compound coat layer 4 is partially etched upon etching of the second silicon coat layer which serves as the phase shifter, a phase error of the phase shifter of the manufactured phase shifting mask is large as compared with the phase shifting mask shown in the embodiment 1. For the purpose of preventing the occurrence of the phase error, an etching stopper film may be provided between the second silicon compound coat layer and the first silicon compound coat layer 4.

Embodiment 3

Figure 2A:
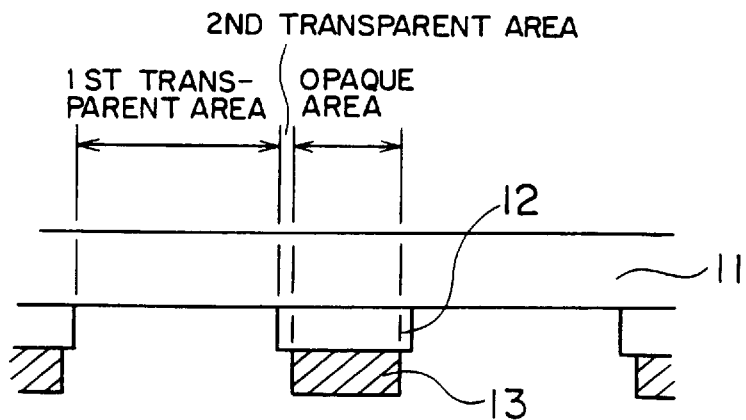
Figure 2B:
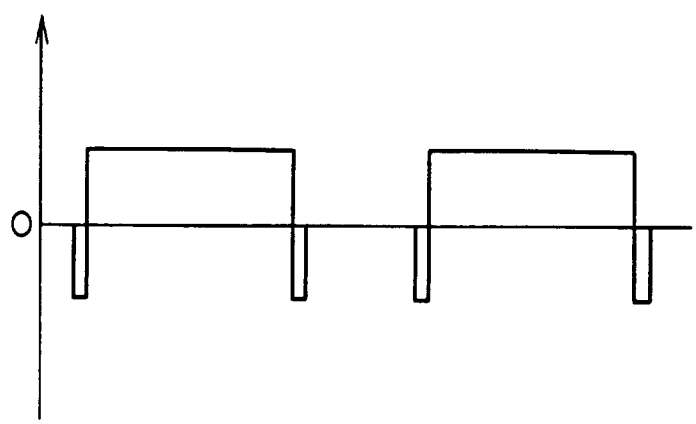
Figure 2C:
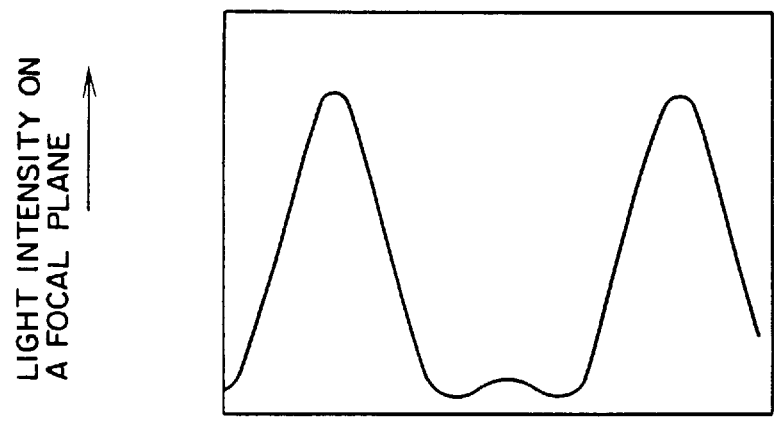
Figure 3A:
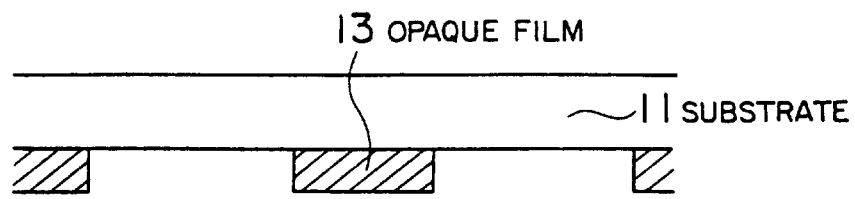
FIGS. 3A and 5A are schematic cross sections of the conventional type masks.
Figure 3B:
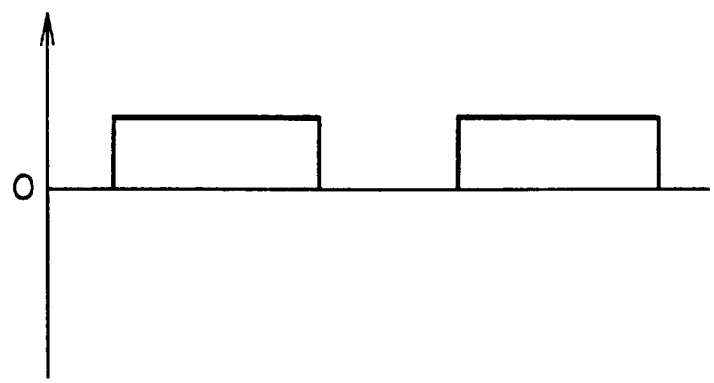
Figure 3C:
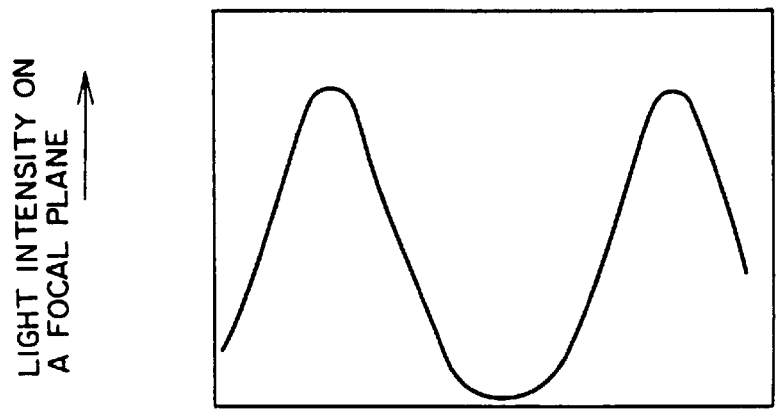

A line/space pattern as shown in FIG. 2A was transferred by use of an i-line (wave length 365 nm) 10:1 reduction projection exposure system having an optical projection system the NA of which is 0.45. The period of the pattern was 1.2 μm, the width of a phase shifter on either side of a light shielding area was 0.05 μm and the width of the light shielding area was 0.5 μm. Accordingly, the above widths on a mark are 0.5 μm and 5.0 μm, respectively. The widths of the light shielding area and the phase shifter are not necessarily limited to the above-mentioned values. However, it is preferable that the width of the phase shifter is smaller than the resolution limit of the conventional mask.

Figure 20A:
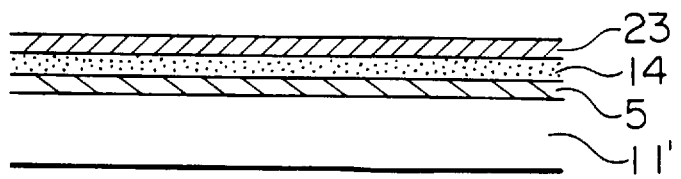
FIGS. 20A to 20F are schematic cross sections showing steps for manufacture of a phase shifting mask.

Next, a mask fabrication process according to the present embodiment will be shown by use of FIGS. 20A to 20F. First, a first silicon nitride film 5 of 100 nm thickness, a silicon oxide film 14 of 420 nm thickness and a chromium film 23 of 80 nm thickness were successively laminated on a synthetic quartz substrate 11' (FIG. 20A). The first silicon nitride film 5, the silicon oxide film 14 and the chromium film 23 are used as a stopper film upon etching of phase shifter, a phase shifter film and an opaque film, respectively. Though the silicon oxide was used as the material of the phase shifter film, organic polymer such as resist which is transparent to exposure light, silicon nitride, magnesium fluoride, lithium fluoride, SOG (spin on glass), etc. may be used. Also, though the chromium film was used as the opaque film, a molybdenum silicide film and so on may be used. Further, the etching stopper is not limited to the silicon nitride film and it is also possible to omit the etching stopper film. Furthermore, a transparent conducting or antistatic film may be laminated in addition to the above-mentioned film.

Generally, the optimum value for the film thickness of the phase shifter is determined by the following equation:

$$d = \lambda/2(n-1) \qquad (1)$$

Figure 20B:
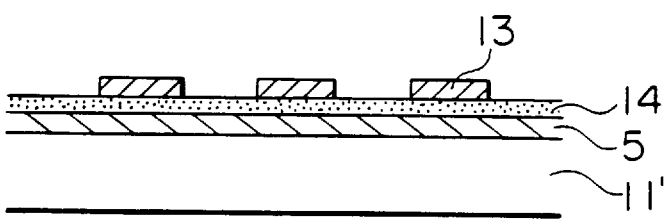
Figure 20C:
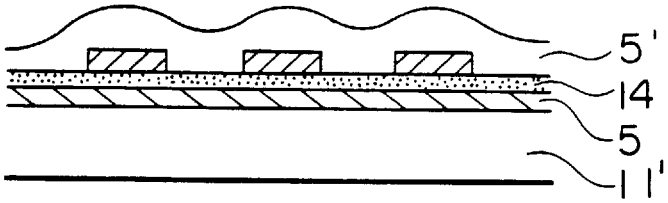
Figure 20D:
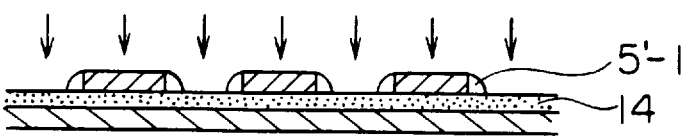
Figure 20E:
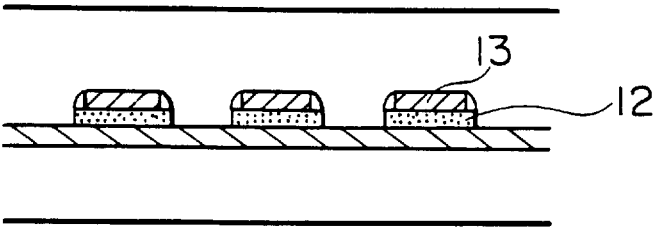
Figure 20F:
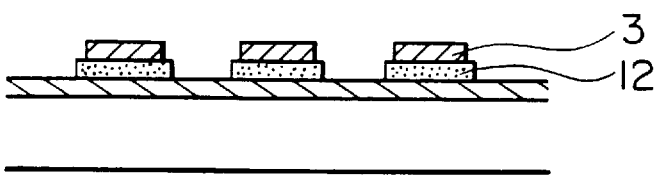

In the present embodiment, λ representing an exposure wave length was 365 nm and n representing the refractive index of the silicon oxide film at the exposure wave length was 1.43. According to the above equation, the thickness of the silicon oxide film 14 serving as the phase shifter was selected to about 424±10 nm. The substrate 11' was coated with a negative tone resist material RD2000N (product name by Hitachi Chemical Co., Ltd.) and a predetermined light shielding area was exposed using an EB direct writing system. Though the RD2000N (product name by Hitachi Chemical Co., Ltd.) was used in the present embodiment, another resist may be used. After a resist film having a predetermined configuration had been formed by conducting the exposure process and a predetermined resist development process, the etching of the chromium film 23 by wet process was made by use of a predetermined etchant with the resist film being used as a mask. Thereafter, the resist film was removed to obtain a chromium film 13 having a predetermined pattern (FIG. 20B). Next, a uniform second silicon nitride film 5' was deposited on the entire surface of the mask by a plasma CVD process (FIG. 20C). Further, the film 5' was subjected to anisotropic dry etching in a direction of thickness thereof so that a portion of the film 5' having a width of about 0.5 μm is left to form a side wall 5'-1 which is made of the silicon nitride film (FIG. 20D). A coat film such as resist or SOG (spin on glass) may be used in place of the second silicon nitride film 5' and a process such as CVD or vacuum evaporation (vapor deposition) may be 5'-1 used for forming the coat film. Next, the side wall 5'-1 made of silicon nitride and the chromium film 13 were used as a mask to subject the silicon oxide film 14 to anisotropic dry etching (FIG. 20E). Thereafter, the side wall 5'-1 was removed to expose the surface of the silicon oxide film 14 at an outline portion of the chromium film 13, thereby obtaining a desired phase shifting mask (FIG. 20F).

After the chromium film 13 has been formed, the chromium film 13 or the resist film used for forming the chromium film may be used as a mask to anisotropically etch the silicon oxide film 14 by dry process and a small amount of the chromium film 13 may be thereafter isotropically etched to expose the silicon oxide area at the outline portion of the chromium film 13. In this case, it is preferable that the resist film used for forming the chromium film 13 is not removed until the chromium film 13 is isotropically etched.

The method of fabrication of the phase shifting mask is not limited to the foregoing. Another known process may be employed. For example, the coat film left at the side wall portion of the chromium film 13 may be used in itself as a phase shifter. Further, a phase shifter may be formed without any transparent film but by etching the synthetic quartz substrate 11 by a predetermined thickness. Also, without forming the first silicon nitride film 5 and the silicon oxide film 14 as in the present embodiment, a chromium film 23 having a predetermined thickness may be formed on the synthetic quartz substrate 11. In this case, the chromium film is processed and the second silicon nitride film 5' is thereafter formed. Further, the subsequent steps until the formation of the side wall 5'-1 are conducted as mentioned in conjunction with the present embodiment. The side wall 5'-1 made of silicon nitride is used as a phase shifter film.

The inspection of a defect in the phase shifting mask thus fabricated was made and a defect or a substantially rectangular phase shifter deficiency having a size of about 0.5 μm×0.5 μm was detected. Since the maximum size of this defect is considerably small or smaller than a half of 1.62 μm and hence the defect is not one which remarkably deteriorates the pattern resolution, no correction for the defect was made.

Next, the phase shifting mask fabricated as mentioned above was transferred by use of the above-mentioned reduction projection system onto a resist film with which a silicon substrate is coated. For comparison, the transfer of a line/space pattern having the same dimension was made by use of the conventional type mask. In the present embodiment, TSMR8900 (product name by Tokyo Ohka Kogyo Co.) was used for the resist film. However, another resist material may be used. Also, though the value of coherency was 0.5 in the present embodiment, another value may be used. After exposure, a predetermined development process was conducted so that a resist film having a predetermined configuration is formed on the substrate. The formed resist pattern was observed by a scanning electron microscope (SEM). As a result, it was confirmed that the case using the mask according to the present invention can form a pattern having a cross-sectional form which is more perpendicular as compared with the case using the conventional type mask. Also, the exposure latitude was improved by about 30%. Further, the depth of focus of about ±1.5 μm centering around an in-focus level was obtained.

Embodiment 4

Figure 4A:
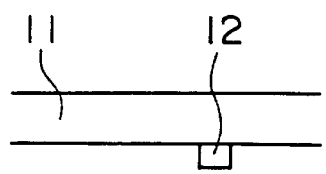
Figure 5A:
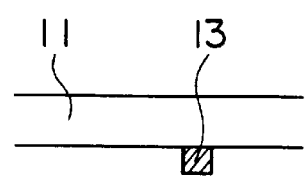
Figure 4B:
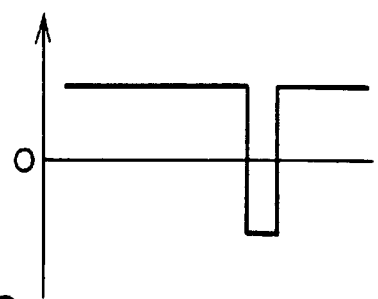
Figure 5B:
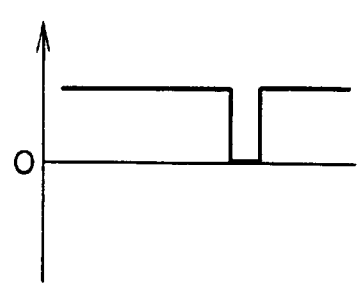
Figure 4C:
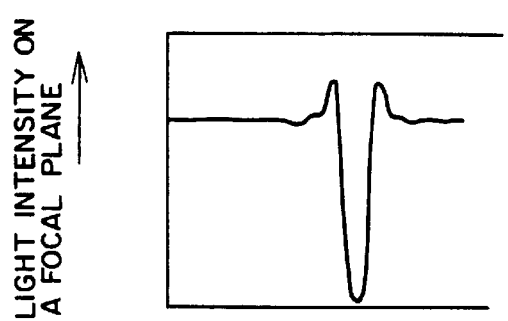
Figure 5C:
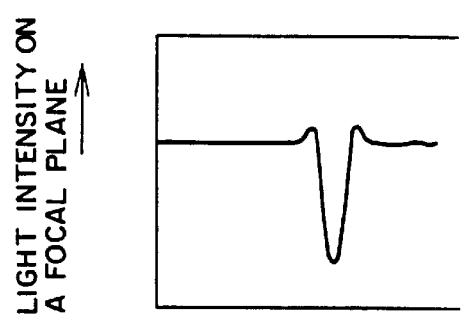
Figure 21A:
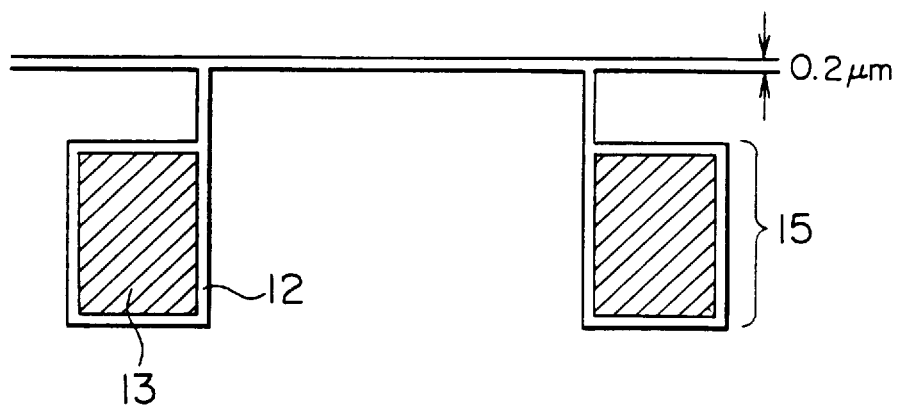
FIGS. 21A and 21B are plan views of a phase shifting mask.
Figure 21B:
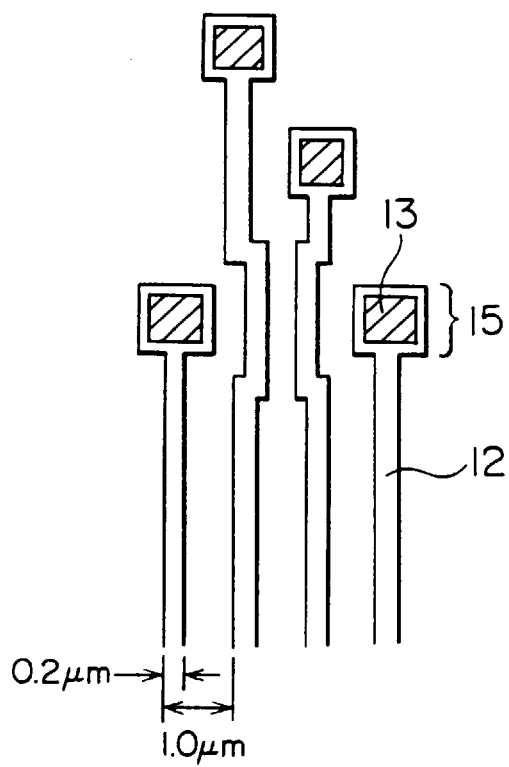

An LSI wire pattern and a GaAs MOEFET gate pattern having a period of 1.0 μm were transferred using a g-line 10:1 reduction projection system (wave length 436 nm) having an optical projection system the NA of which is 0.54. The arrangement of light shielding pattern and phase shifter of a mask used in the present embodiment is shown in FIGS. 21A and 21B. The dimensions shown in the figures represent values on a wafer reduced to ⅟10. In the mask according to the present embodiment, the gate or wire portion is mainly constructed by only the phase shifter 12 without the light shielding pattern (or opaque area) 13. Namely, the mask is based on the principle shown in FIGS. 4A to 4C. The width of the phase shifter was 0.2 μm (on the wafer). Though the width is not limited to 0.2 μm, it is preferable that the width is not larger than the resolution limit of the conventional mask. A pad portion 15 at an end of the wire was provided with the opaque area 13. The phase shifter 12 having a narrowed width was arranged at an outline portion of the opaque area 13. Also, the thickness of silicon oxide serving as the phase shifter 12 was selected to about 520 nm by using λ=436 nm and n=1.42 in the equation (1) mentioned in conjunction with the embodiment 3.

Next, a process for fabrication of the mask will be shown. First, a transparent antistatic film 2, a silicon nitride film 5, a silicon oxide film 14 and a chromium film 23 were successively laminated on a synthetic quartz substrate 11'. The thickness of the silicon oxide was 520 nm. The transparent antistatic film 2, the silicon oxide film 14 and the chromium film 23 are used as an antistatic layer upon direct EB writing, a phase shifter film and an opaque film, respectively. Also, the silicon nitride film 5 was selected to about 220 nm by employing λ=436 nm and n=2 in the equation (1) since the film 5 is used as not only an etching stopper film upon etching of a phase shifter but also a film for facilitating the correction for a defect in the phase shifter. The substrate was coated with a negative tone resist material RD 2000N (product name by Hitachi Chemical Co., Ltd.) and a predetermined light shielding area is delineated using an EB direct writing system. Thereafter, a predetermined development process was conducted to form a first resist film having a predetermined pattern and the chromium film 23 was then etched by wet process with the first resist film being used as a mask, thereby forming a chromium film 13 at the above-mentioned pad portion. Next, coating with the above-mentioned resist was conducted again and phase shifters at the gate and wire portions as shown in FIGS. 21A and 21B are delineated by use of the EB direct writing system. Thereafter, a predetermined resist development process was conducted to form a second resist film having a predetermined pattern. Further, the silicon oxide film was etched by wet process with the second resist film being used as a mask, thereby forming a phase shifter 12 at the above-mentioned gate or wire portion. Next, a small amount of the chromium film 13 at the pad portion was isotropically etched to expose the silicon oxide film at the outline portion of the chromium film, thereby obtaining a mask having desired phase shifters.

The method of fabrication of the phase shifting mask is not limited to the foregoing. Another known process may be employed.

A mask pattern of the phase shifting mask thus fabricated was transferred by use of the above-mentioned reduction projection system onto a resist film with which a silicon substrate is coated. In the present embodiment, TSMR8900 (product name by Tokyo Ohka Co.) was used for the resist film. However, another resist material may be used. After exposure, a predetermined exposure process was conducted to delineate a pattern in the resist film on the silicon substrate. The resist film having the formed pattern was observed by a scanning electron microscope (SEM). As a result, it could be confirmed that the wire pattern is formed with a satisfactory configuration and cross-sectional form. Also, the depth of focus of about $\pm 1.0$ $\mu$m centering around an in-focus level was obtained.

Next, semiconductor devices were manufactured using the phase shifting mask manufactured as mentioned above. As a result, it was possible to manufacture the semiconductor devices which have satisfactory characteristics.

Embodiment 5

Figure 6A:
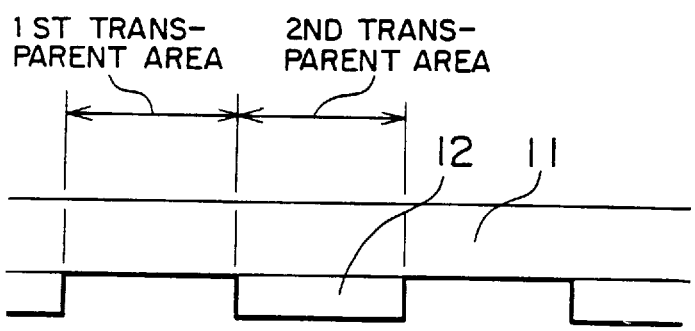
Figure 6B:
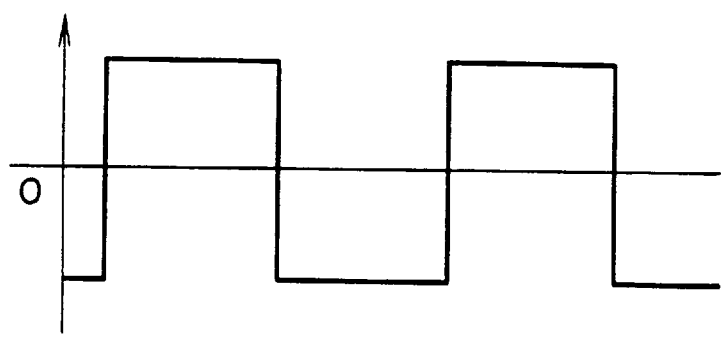
Figure 6C:
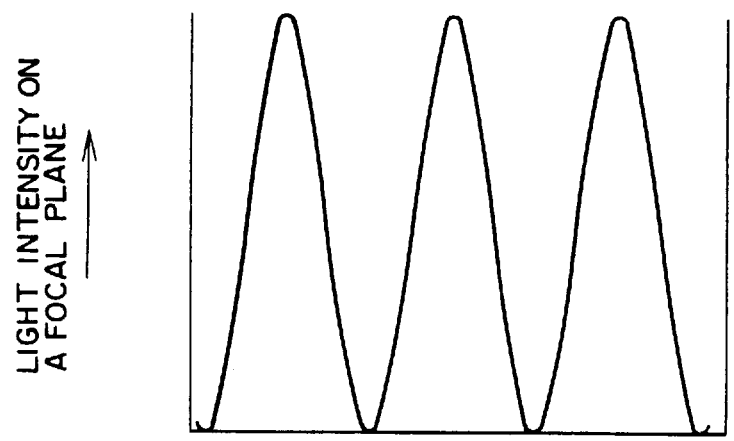
Figure 7:
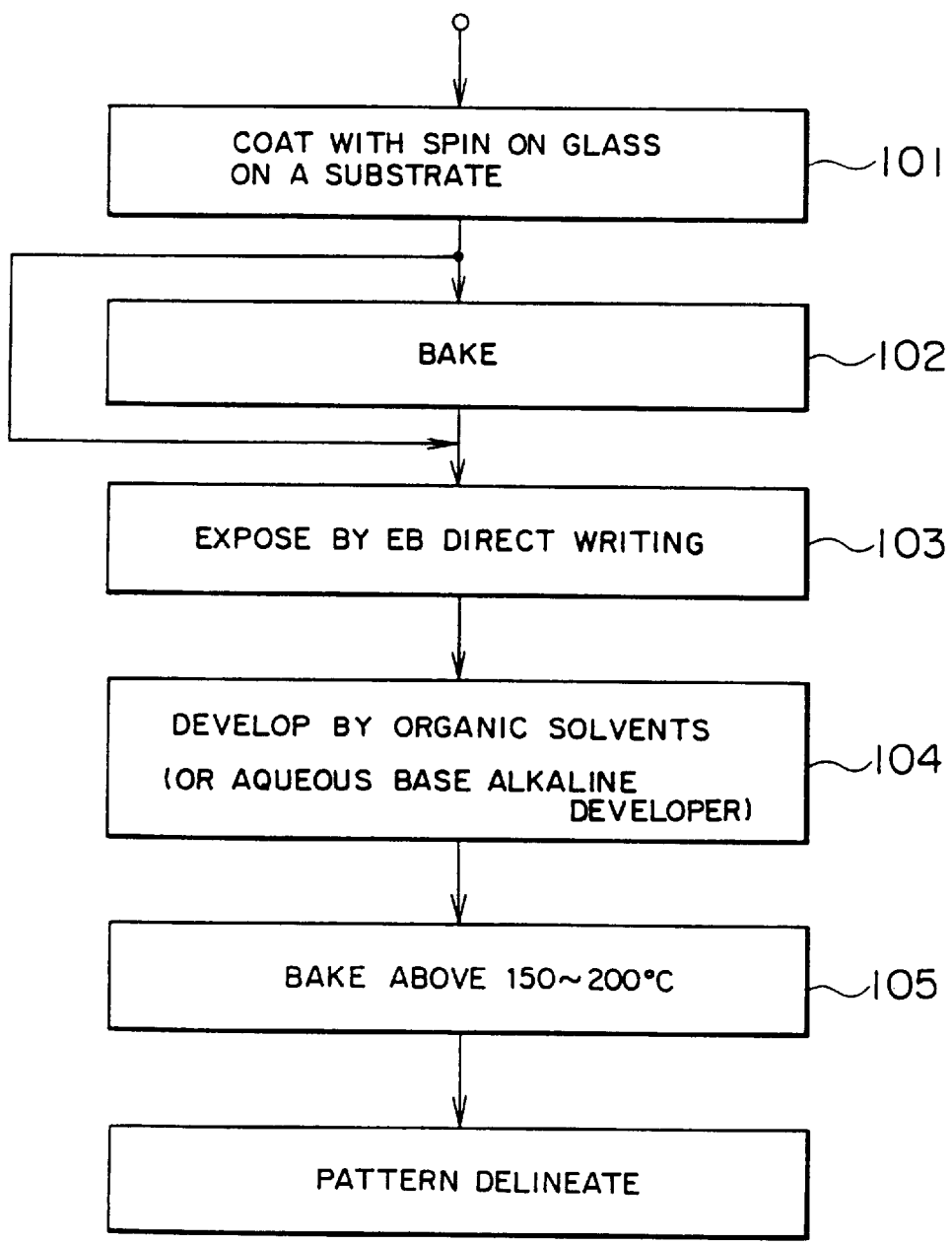
FIGS. 7, 9 and 10 are flow charts showing examples of a method of forming a mask pattern.
Figure 8:
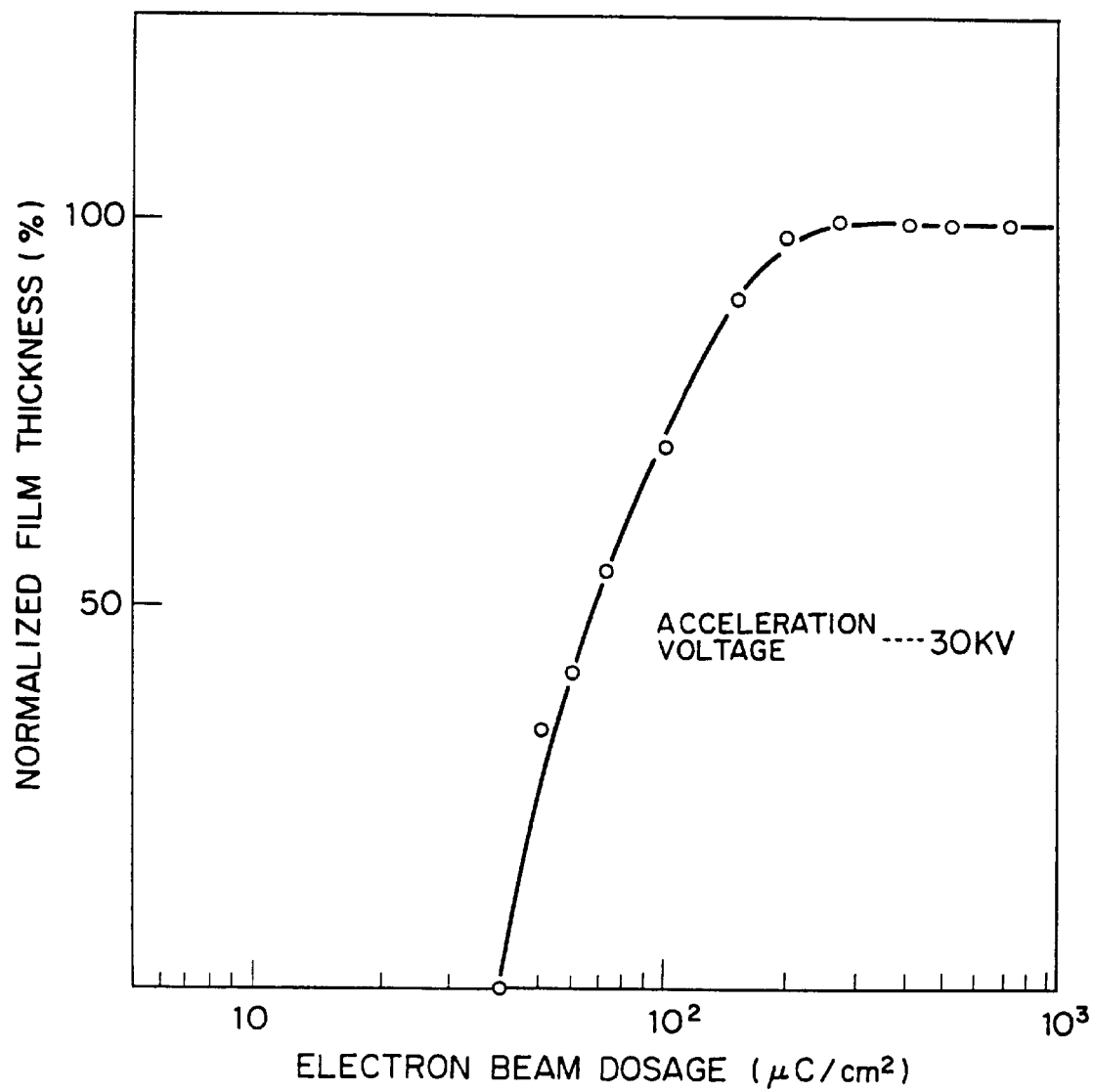
FIG. 8 is a graph showing the relation of a normalized thickness of a spin on glass film with an electron beam dosage when the spin on glass film is subjected to electron beam exposure and development.
Figure 9:
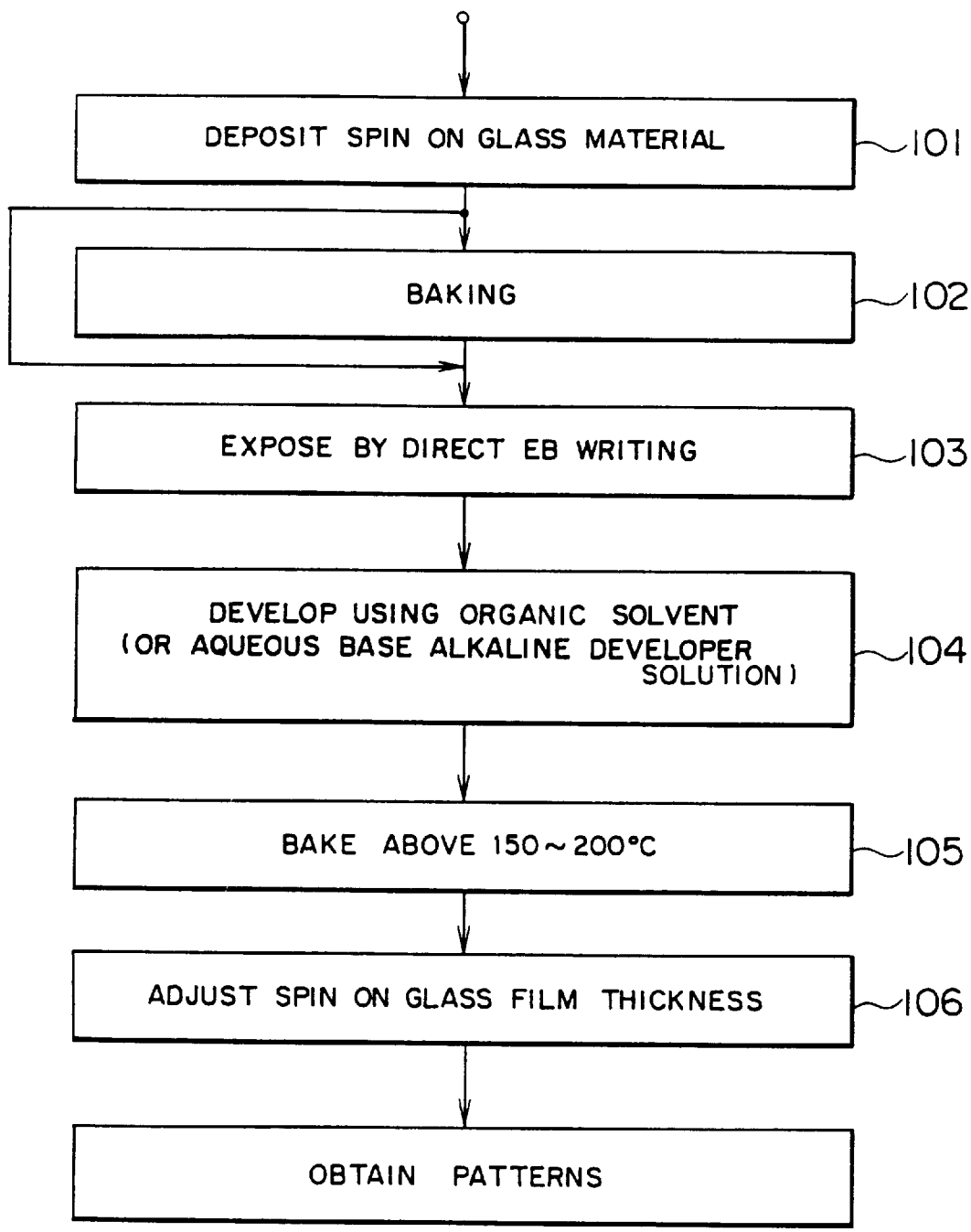
Figure 10:
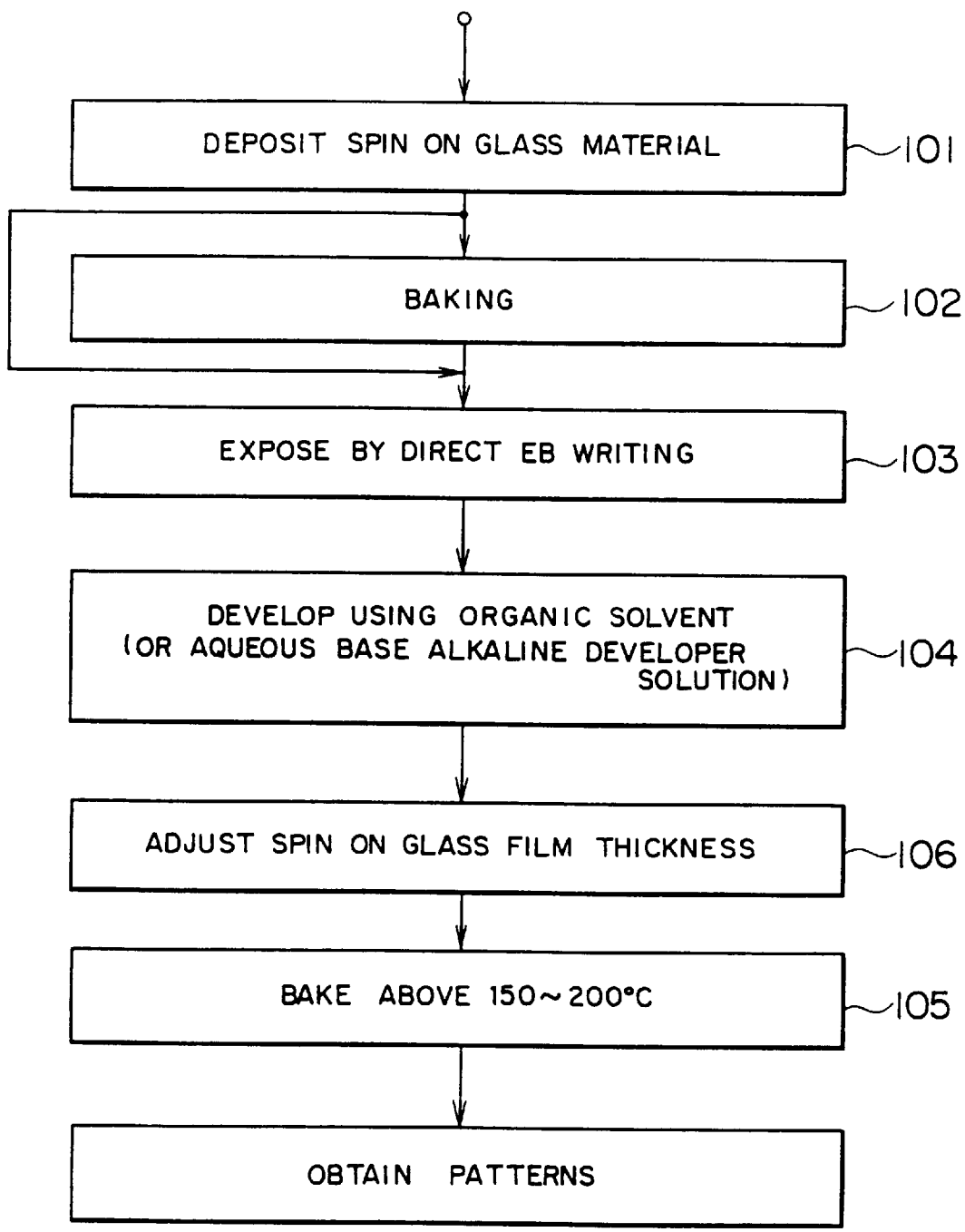
Figure 11:
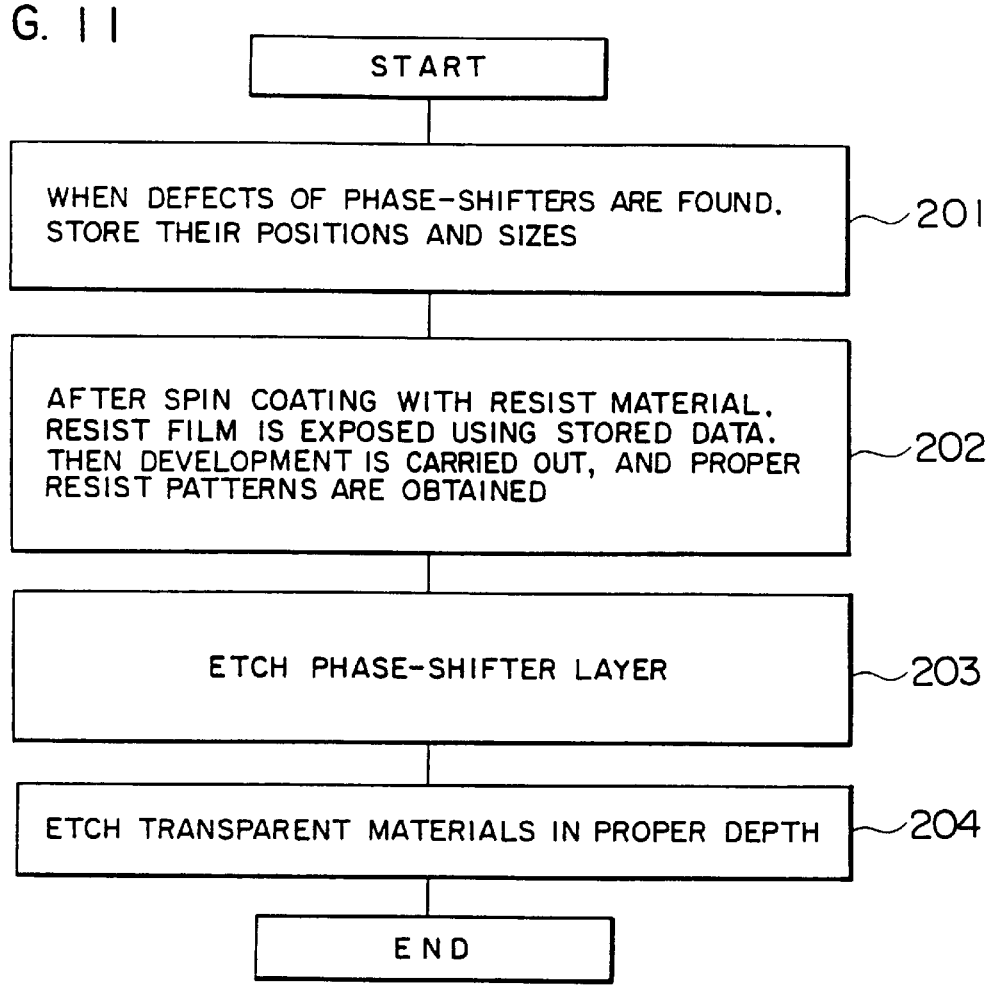
FIGS. 11 to 15 and 17 are flow charts showing mask defect inspection/correction methods.
Figure 12:
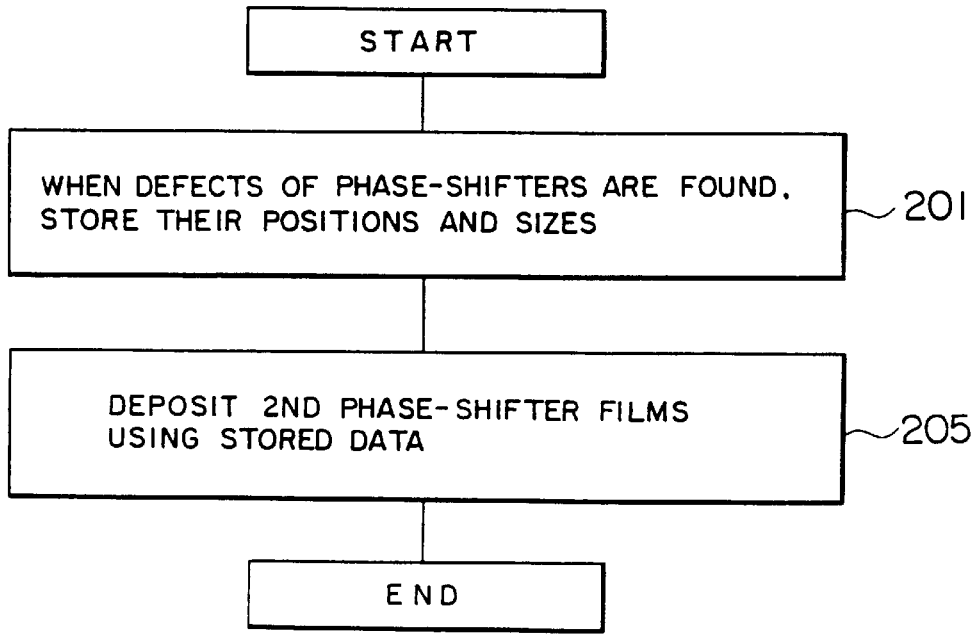
Figure 13:
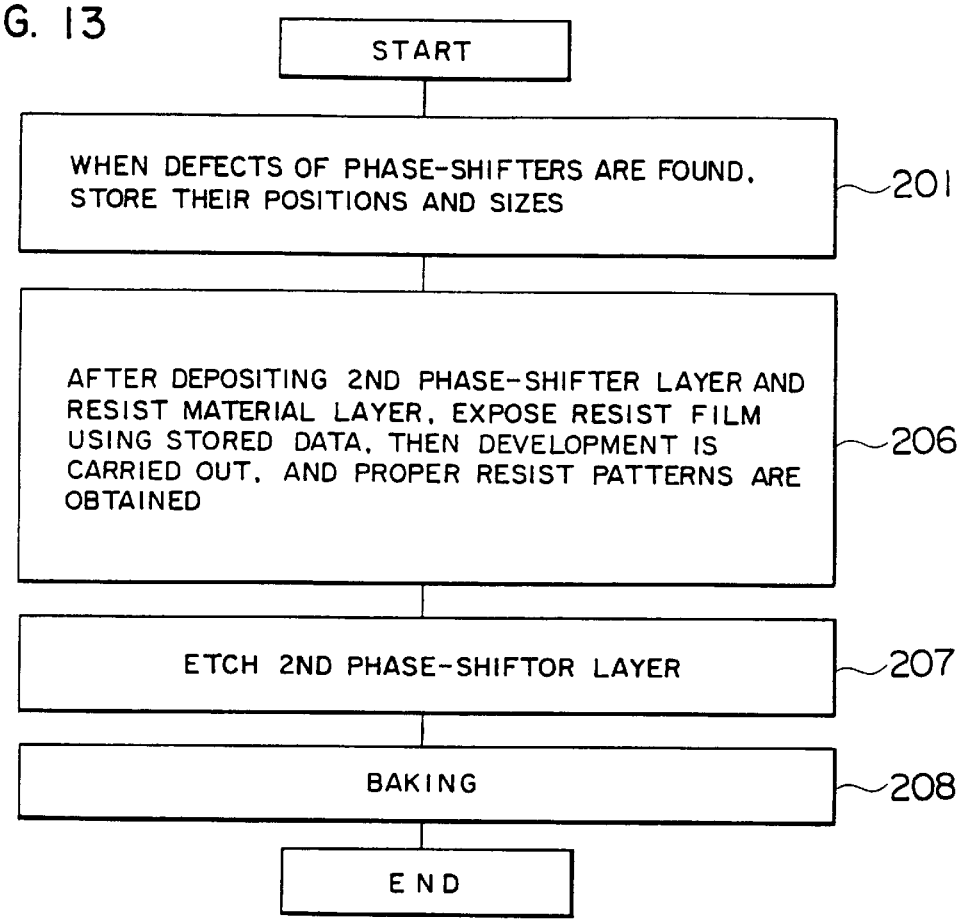
Figure 14:
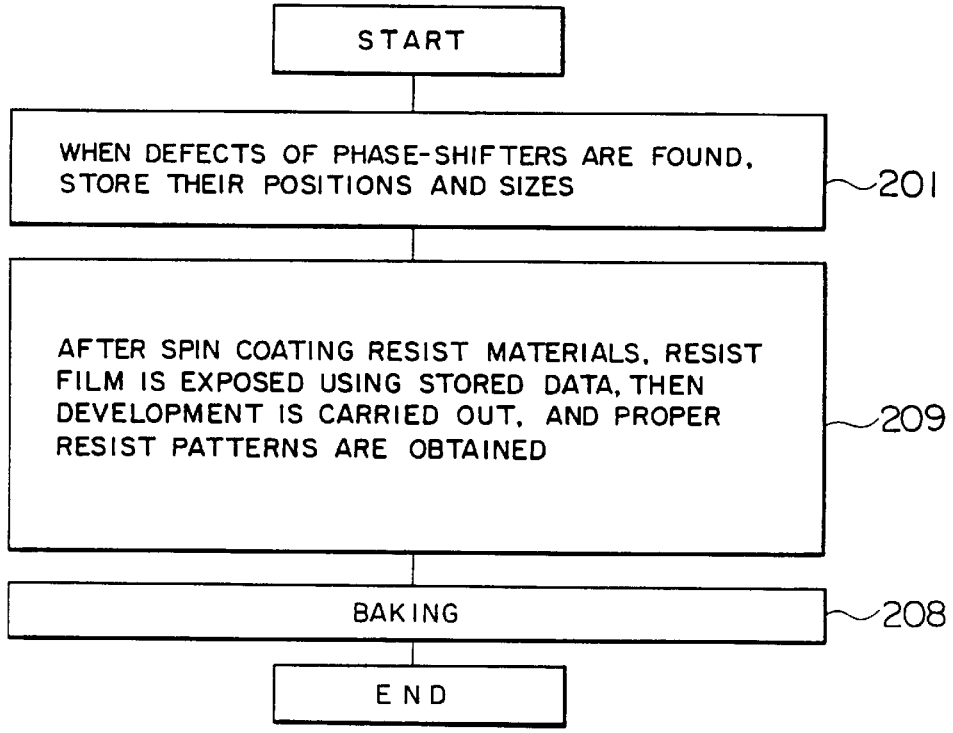
Figure 15:
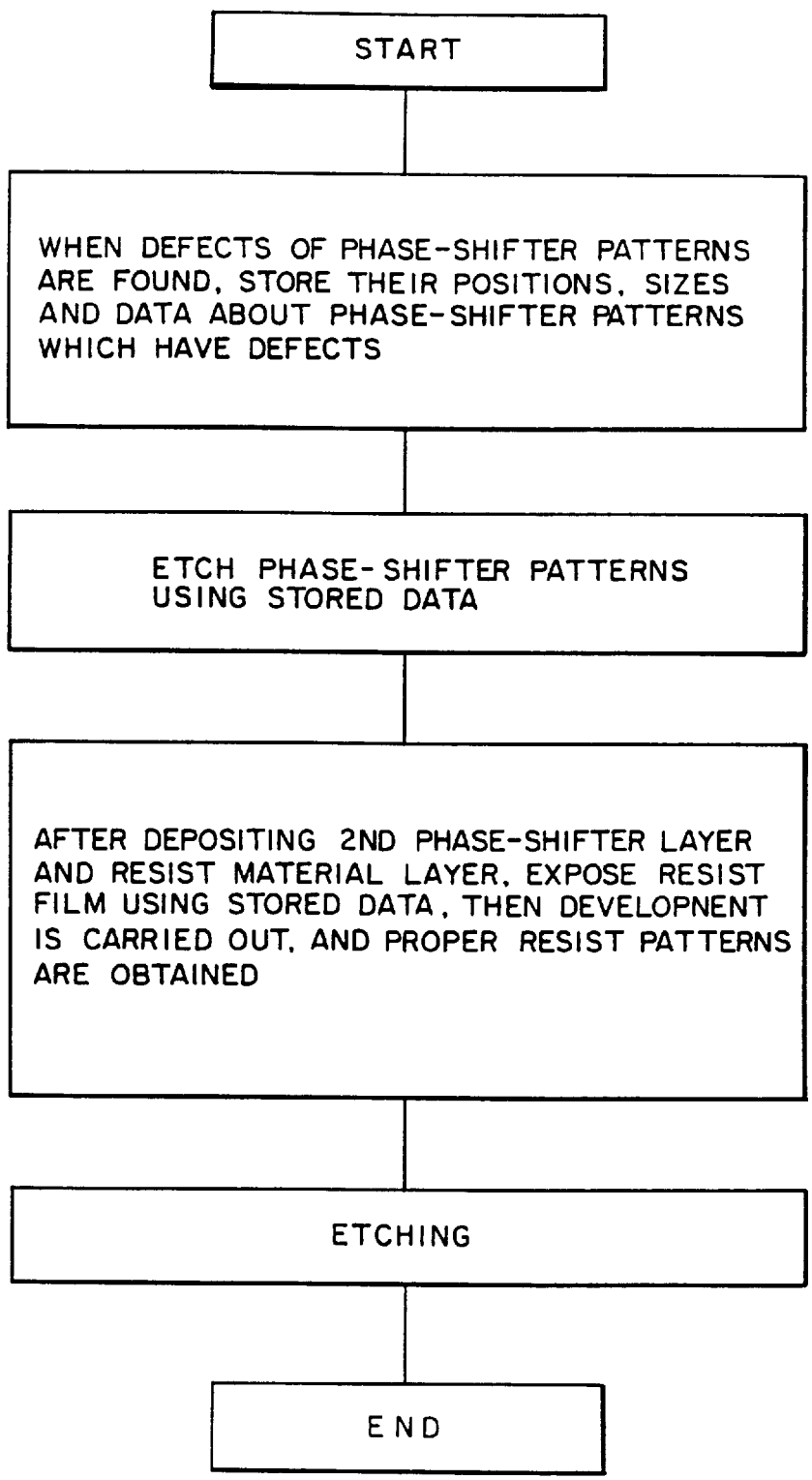
Figure 16A:
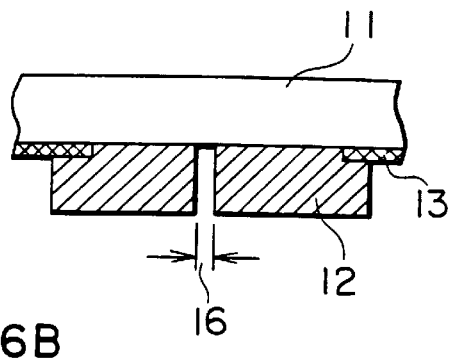
FIGS. 16A to 16D are schematic cross sections of a phase shifting mask before and after correction of a defect in a phase shifter.
Figure 16B:
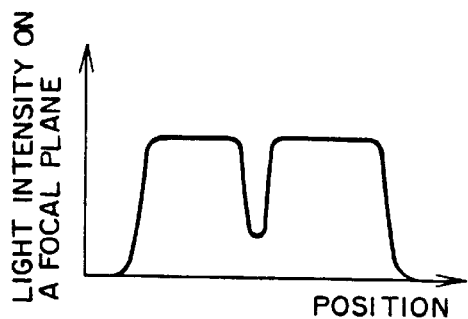
Figure 16C:
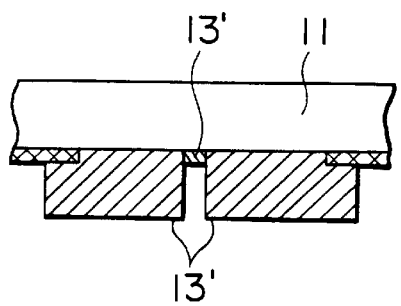
Figure 16D:
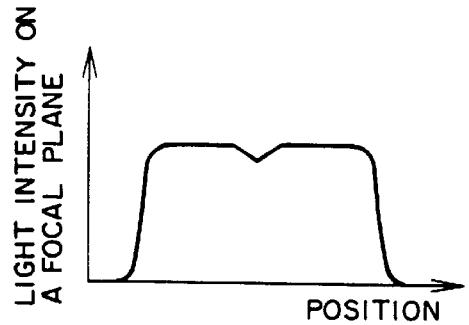
Figure 17:
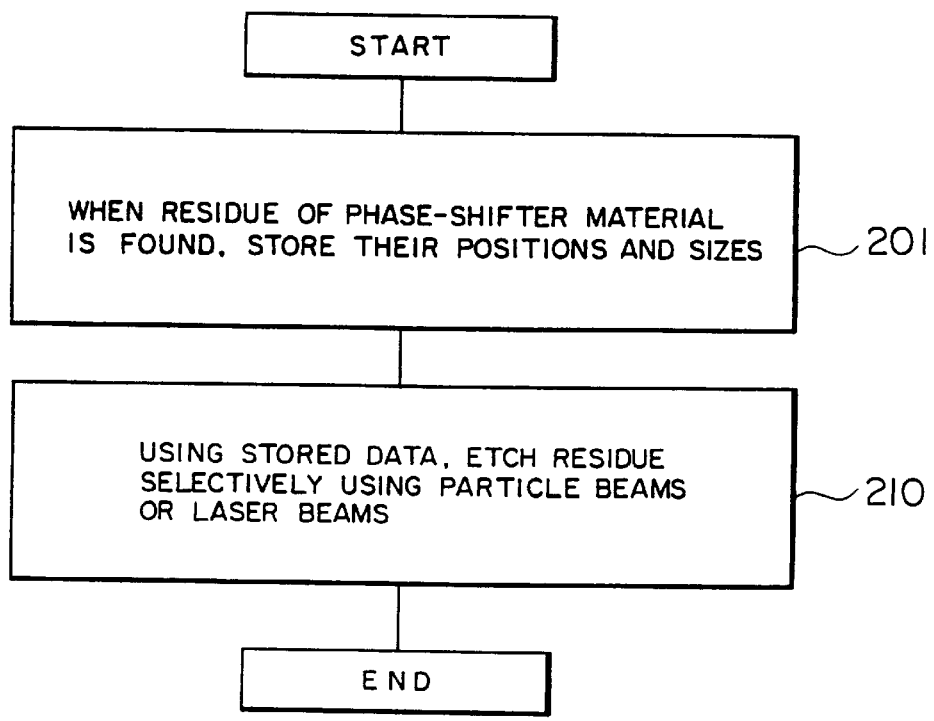

A 0.2 $\mu$m line/space pattern (having a period of 0.4 $\mu$m) was transferred by use of a 5:1 reduction projection KrF excimer laser stepper having an NA of 0.37 and on the basis of the principle shown in FIGS. 6A to 6C. Namely, in a mask according to the present embodiment, the boundary between a usual light shielding portion and a phase shifter is used as a light shielding portion. Accordingly, the period of the line/space pattern formed on a wafer becomes a half of the period of a phase shifter pattern arranged on the wafer. Thus, phase shifters of 2.0 $\mu$m width were arranged with a period of 4.0 $\mu$m on the mask.

First, there was prepared a synthetic quartz substrate on which a silicon nitride film is successively laminated. The silicon nitride film is provided for facilitating the correction for a defect in phase shifter and the thickness thereof was selected to about 95 nm by using $\lambda$=248 nm and n=2.3 in the equation (1) mentioned in conjunction with the embodiment 3.

Next, the entire surface was coated with a spin on glass material OCD Type 7 8000T (product name by Tokyo Ohka Kogyo Co.). The optimum film thickness for the phase shifter is about 250 nm by employing $\lambda$=248 nm and n=1.5 in the equation (1). On the other hand, in the case of the spin on glass material used in the present embodiment, the film thickness thereof results in about 90% of the coat film thickness after a development process and a baking process which will be mentioned hereinafter. Therefore, in the present embodiment, the coat film thickness of the spin on glass film was selected to about 280 nm. Thereafter, a phase shifter 12 having a predetermined pattern was formed in such a manner as mentioned in the embodiment 1, thereby manufacturing a desired phase shifting mask.

The method of fabrication of the phase shifting mask is not limited to the foregoing. Another known process may be employed. For example, the above-mentioned resist pattern itself may be used as a phase shifter without using any spin on glass film. Also, a phase shifter may be formed by etching the synthetic quartz substrate by a predetermined depth.

The phase shifting mask thus manufactured was inspected using a predetermined mask defect inspection system. As a result, no defect in the phase shifter pattern was detected but the residue of spin on glass material was detected at a part of the periphery of the phase shifter pattern. Also, the result of measurement of the film thickness of the phase shifter 12 showed about 275±5 nm. This value is larger by about 25 nm than the optimum film thickness of about 250 nm for the phase shifter as mentioned above. Therefore, in order to remove the residue and to adjust the phase shifter film thickness, the phase shifter film was etched by use of an etchant in which hydrofluoric acid (having a density of 50%) is diluted to $\frac{1}{120}$ with ammonium fluoride (having a density of 50%). Since the etching rate of the phase shifter film for the etchant was about 3 nm/sec, the etching time was selected to 9 seconds. Since the etching rate of the silicon nitride film for the etchant is slow by about one order as compared with the etching rate of the phase shifter film for the etchant, only about 2 nm of the silicon nitride film was etched through the above etching process.

Figure 22A:
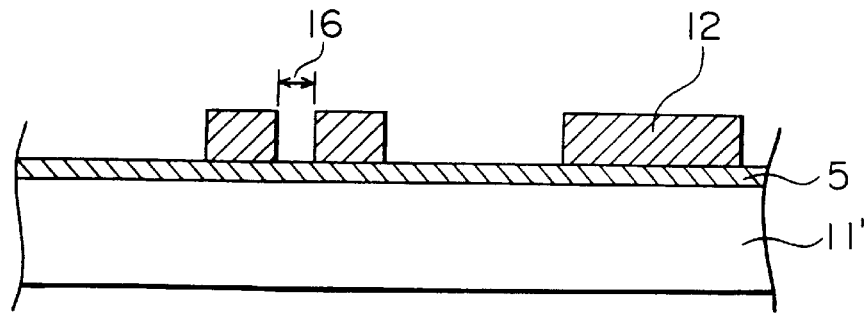
FIGS. 22A to 22D, 23A and 23B are schematic cross sections showing steps for correction of defects in phase shifters.

Next, the film thickness of the formed phase shifter was measured by use of a film thickness measurement system and a desired value of 250±10 nm was obtained in the mask pattern area. Next, the inspection of a defect in the mask was made again and a phase shifter defect was detected. The structure of the cross section of the phase shifting mask used in the present embodiment has a structure in which a phase shifter 12 including a silicon nitride film 5 and a silicon oxide film is formed on a synthetic quartz substrate 11', as shown in FIG. 22A.

As the result of inspection after the fabrication of the mask, there was detected a phase shifter deficiency defect 16 which substantially centers around a position of coordinate (−914.3 $\mu$m, 824.7 $\mu$m) when the center of the mask is taken as the origin and the x-axis and the y-axis are perpendicularly provided in directions parallel to respective sides. The shape of the defect was substantially an ellipse and the size thereof was in an extent which is sufficiently included in a rectangular of 3 $\mu$m in the x-direction and 2 $\mu$m in the y-direction. Also, there was detected a second phase shifter deficiency defect (not shown.) which substantially centers around a position of coordinate (821.3 $\mu$m, −8.2 $\mu$m). The shape of this defect was substantially a rectangle and the size thereof was in an extent which is sufficiently included in a rectangle of 1 $\mu$m in the x-direction and 3 $\mu$m in the y-direction. Therefore, the defect was corrected in a manner as will be mentioned hereinbelow.

Figure 22B:
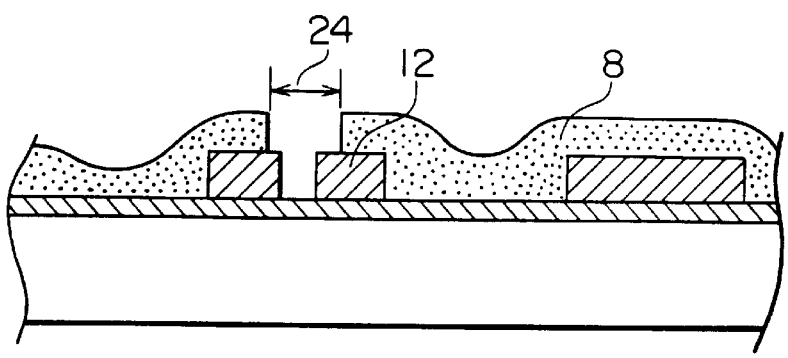
Figure 22C:
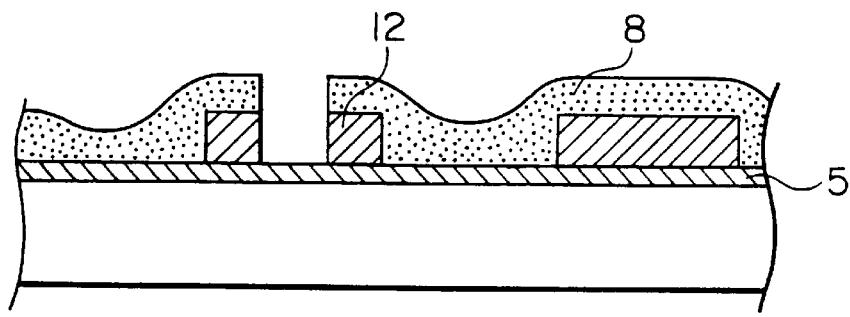
Figure 22D:
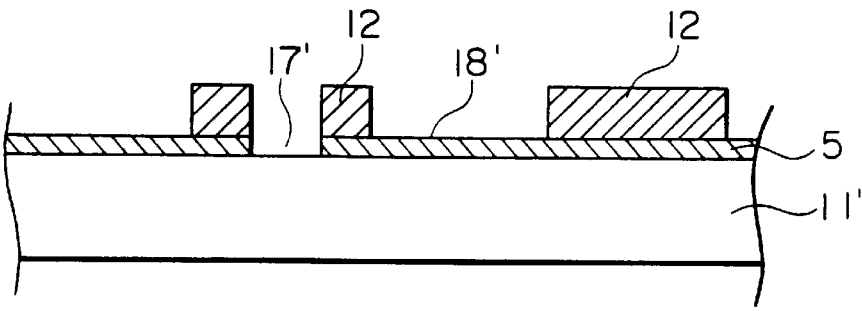

First, the substrate 11' was coated with a positive tone resist material OEBR-2000 (product name by Tokyo Ohka Kogyo Co.), a 3 $\mu$m×3 $\mu$m rectangular figure centering around coordinates (−914.3 $\mu$m, 824.7 $\mu$m) and (821.3 $\mu$m, −8.2 $\mu$m) was delineated, and a predetermined development process was conducted to form a resist pattern 8 having an opening portion 24, as shown in FIG. 22B. (The latter figure delineated is not shown.) Though the positive tone resist material OEBR-2000 was used in the present embodiment, another resist material may be used. Next, as shown in FIG. 22C, the silicon oxide film forming the phase shifter 12 was selectively removed by an anisotropic dry etching process with the resist pattern being used as a mask. Next, the silicon nitride film 5 lying under the silicon oxide film was selectively removed by an anisotropic dry etching process. Thereafter, the resist 8 was removed by a known process to fabricate a defect-corrected phase shifting mask as shown in FIG. 22D. When a change in phase at the silicon nitride film 5 and a change in phase at the phase shifter 12 are taken into consideration, an opening portion 17' where the silicon nitride film is removed and a portion where the silicon oxide film forming the phase shifter 12 is formed are the same in phase and are reverse in phase to a portion 18' where only the silicon nitride film is deposited. Therefore, this mask serves as a phase shifting mask with no problem. In fact, any defect was not observed at all in a pattern printed using this mask.

Figure 23A:
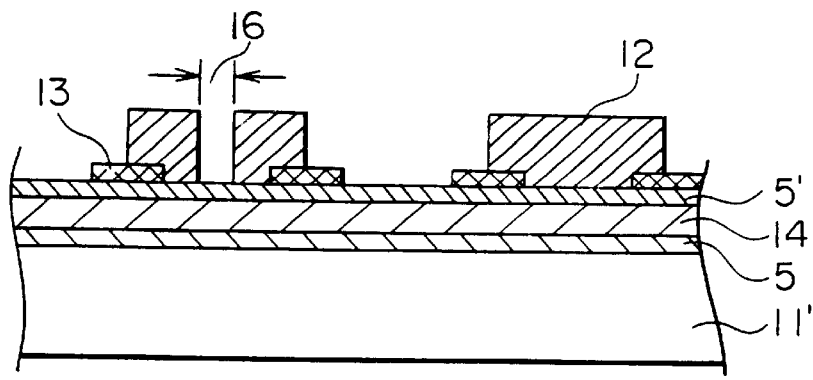

In the present embodiment, the thickness of a single layer including the silicon nitride film was selected to the predetermined value as mentioned above. However, the combination of a plurality of layers may be used with a total film thickness which provides a phase change similar to a phase shifter. For example, the structure of the cross section of a phase shifting mask in a phase shifter area may take a structure in which a silicon nitride film (100 nm) 5, a silicon oxide film 14, a silicon nitride film (100 nm) 5' and a silicon oxide film (415 nm thickness) forming a phase shifter 12 are successively laminated on a synthetic quartz substrate 11', as shown in FIG. 23A. In order that two layers including the silicon oxide film 14 and the silicon nitride film 5' serve as a phase shifter in combination, the thickness $\underline{d}$ of the silicon oxide film 14 may be selected to 181 nm in accordance with $$100 \times (2.03-1) + d \times (1.44-1) = \frac{1}{2} \times 365.$$

Figure 23B:
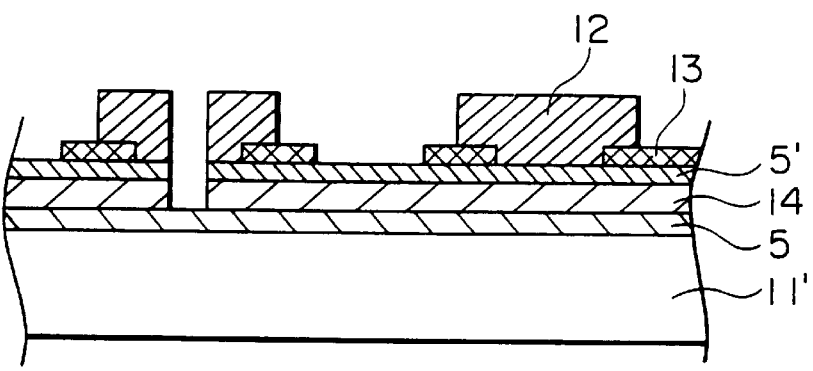

Also, the silicon nitride films 5 and 5' serve as stopper films upon etching of the silicon oxide films 14 and 12 which lie over the silicon nitride films 5 and 5'. In this case, when a defect in the mask is corrected, the resulting mask assumes a structure as shown in FIG. 23B. A mask pattern was transferred by use of the defect-corrected phase shifting mask, with the result that the mask pattern can be transferred without yielding any abnormality even at portions which correspond to the above-mentioned phase shifter defect portions.

In the present embodiment, the silicon nitride and the silicon oxide were used as interlayer materials. However, the interlayer material is not limited to those materials and there may be used a transparent material such as tantalum oxide or titanium oxide which is transparent to exposure light. Accordingly, polyimide may be used in the case where the wave length of the exposure light is 436 nm (g-line). Also, transparent antistatic film such as ITO (indium tin oxide), etc. may be used.

Further, though the silicon nitride film 5' was used as the stopper film upon etching of the silicon oxide film forming the phase shifter 12, as mentioned above, the silicon nitride film 5' may be omitted if a spin on glass layer is formed in place of the silicon oxide film forming the phase shifter 12 or if the silicon oxide film 14 is formed by sputtering. Since the etching rate for a solution including hydrofluoric acid and ammonium fluoride at the ratio of 1:20 is 30 nm/min in the case of the film formed by sputtering and 600 nm/min in the case of the spin on glass layer, it was possible to selectively process the spin on glass layer.

The above-mentioned phase shifter defect was corrected and the inspection of the mask was made again. As a result, a satisfactory mask free of a defect in phase shifter pattern was obtained. Further, after cleaning was made 100 times by a predetermined mask cleaning apparatus, the mask was inspected again and no abnormality was found out in the phase shifter pattern.

The pattern of the phase shifting mask fabricated as mentioned above was transferred by use of the beforementioned stepper onto a chemically amplified negative tone resist material SAL-601 (product name by Shipley Co.) with which a silicon substrate is coated. Though the value of coherency was 0.3 in the present embodiment, another value may be used. Also, though the chemically amplified negative tone resist material SAL-601 (product name by Shipley Co.) was used in the present embodiment, another resist material may be used. After the pattern was exposed under a predetermined exposure condition, a predetermined post exposure baking process was conducted. Thereafter, a development process was conducted to form a resist film having a predetermined pattern.

The configuration of the formed resist film was observed by a scanning electron microscope (SEM). As a result, it was confirmed that the pattern could be formed with a satisfactory configuration. Also, the depth of focus of about ±1 $\mu$m centering around an in-focus level was obtained. Next, semiconductor devices were manufactured using the phase shifting mask manufactured as mentioned above. As a result, it was possible to manufacture the semiconductor devices which have satisfactory characteristics.

Embodiment 6

Figure 24A:
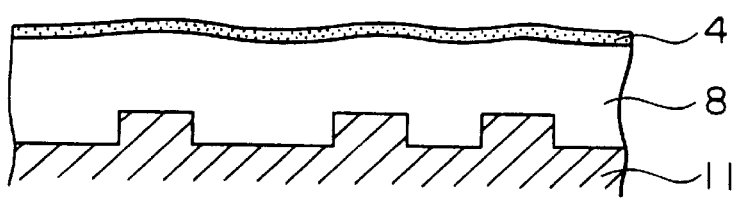
FIGS. 24A and 24B are schematic cross sections showing a pattern delineation process.
Figure 24B:
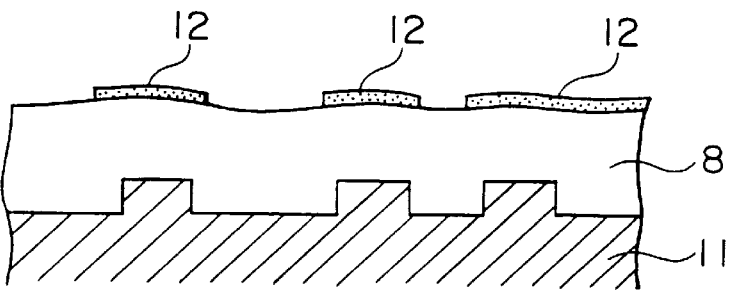

The present embodiment will be explained by use of FIGS. 24A and 24B. First, a substrate 11 having a surface unevenness of about 0.5 $\mu$m was coated with MP1300 (product name by Shipley Co.) with a mean thickness of 1.6 $\mu$m and baking was conducted at 200° C. for 10 minutes, thereby forming a film 8. The film 8 is provided for diminishing the surface unevenness. Though the material of such a film is not limited to the MP1300, an organic material is preferable. Next, the film 8 was spin-coated with a spin on glass material OCD Type 7 (product name by Tokyo Ohka Kogyo Co. and hereinafter referred to as SOG (spin on glass)) 4 of 80 nm thickness. The kind and film thickness of the spin on glass material are not limited to those mentioned above. Thereafter, the substrate was subjected to a baking process at a temperature of 80° C. for 5 minutes. Though the conditions of temperature and time for the baking process are not limited to the values mentioned above, it is preferable to employ a temperature and a time with which the most of methanol which is a main component of a solvent in the SOG 4 evaporates. Also, the condition of the baking process is determined depending upon the kind of a spin on glass material used. Next, a predetermined pattern was delineated by direct EB writing using an EB direct writing system in which an acceleration voltage is 30 kV. In the present embodiment, the maximum shot size and the EB dosage upon exposure or delineation were selected to 1 $\mu$m×1 $\mu$m and 150 $\mu$C/cm$^2$ since the minimum gap size between patterns to be delineated is 0.25 $\mu$m. However, it is needless to say that those conditions may change depending upon the dimensions of a pattern to be delineated and the kind of a spin on glass material used. Further, though an electron beam was used for the pattern delineation, there is not limited to the electron beam. For example, laser light or an ion beam can be used. Thereafter, the substrate was developed by immersing it in methanol for 30 minutes. After the substrate was rinsed out in methanol, it was dried to form a phase shifter 12 having a desired pattern. The inspection of the formed phase shifter 12 using a scanning electron microscope showed a satisfactory result.

Embodiment 7

Explanation will be made of a process for formation of aluminum wires of 64MDRAM which is an embodiment of the present invention. An SOG film having a desired pattern was formed, in a manner as mentioned in the embodiment 6, on a substrate which has thereon an aluminum film formed through a predetermined step. Thereafter, a baking process was conducted at a temperature of 200° C. for 10 minutes. Next, the SOG film was used as a mask so that an MP1300 (product name by Shipley Co.) film with a mean thickness of 1.6 $\mu$m lying thereunder is subjected to etching by a process under a predetermined condition. Further, the aluminum film lying under the MP1300 film was etched by wet process under a predetermined condition. Thereafter, the SOG film and the MP1300 film were removed to form aluminum wires having a desired pattern. The formed wires were inspected by use of a scanning electron microscope. As a result, it was possible to form satisfactory wires.

Embodiment 8

Figure 25A:
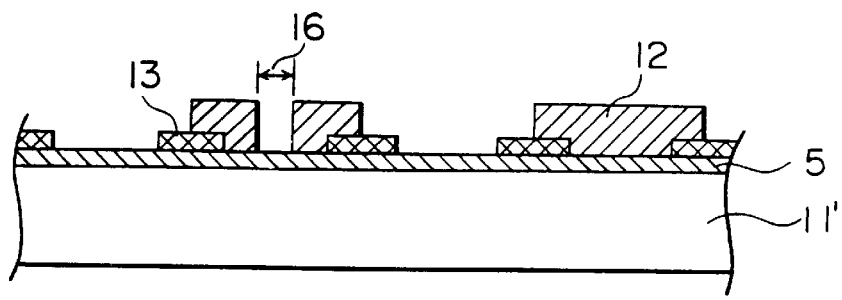
FIGS. 25A to 25D are cross sections showing steps for correction of a defect in a phase shifter.
Figure 25B:
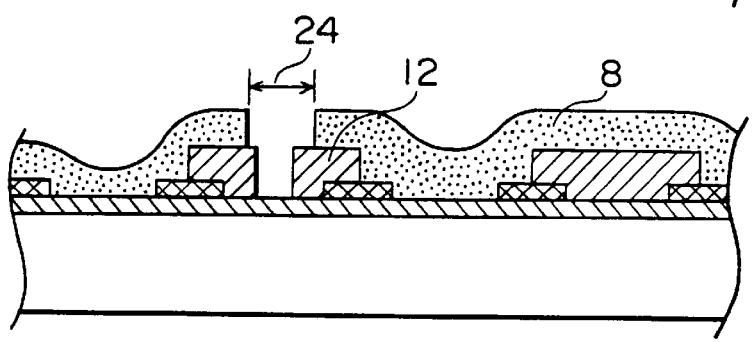
Figure 26:
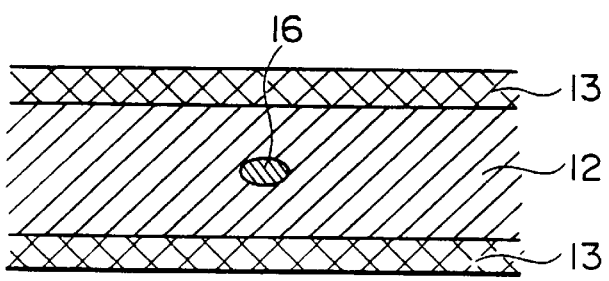
FIG. 26 is a schematic cross section of a phase shifter having a defect.

A phase shifting mask for i-line 10:1 reduction projecting aligner was fabricated and the mask was inspected using a mask pattern defect inspection system. The structure of the cross section of the phase shifting mask used in the present embodiment has in a phase shifter area a structure in which a silicon nitride film 5 (100 nm thickness) and a phase shifter 12 (388 nm thickness) including a silicon oxide film are laminated on a synthetic quartz substrate, as shown in FIG. 25A. The silicon nitride film 5 serves as an etching stopper film upon processing of the silicon oxide film. A chromium film was used for a light shielding film 13. As the result of the inspection, there was found out a phase shifter defect portion 16, as shown in FIG. 25A, which substantially centers around a position of coordinate (−1258.3 $\mu$m, 5526.7 $\mu$m) when the center of the mask is taken as the origin and the x-axis and the y-axis are perpendicularly provided in directions parallel to respective sides. A plan view of the defect portion 16 is shown in FIG. 26. The shape of the defect portion was substantially an ellipse and the size thereof was in an extent which is sufficiently included in a rectangle of 2 $\mu$m in the x-direction and 3 $\mu$m in the y-direction. The experiments of pattern transfer using this mask showed that the light intensity at the defect portion is remarkably reduced, thereby making it impossible to form a desired pattern. In the following, a method of correcting this defect will be mentioned.

Figure 25C:
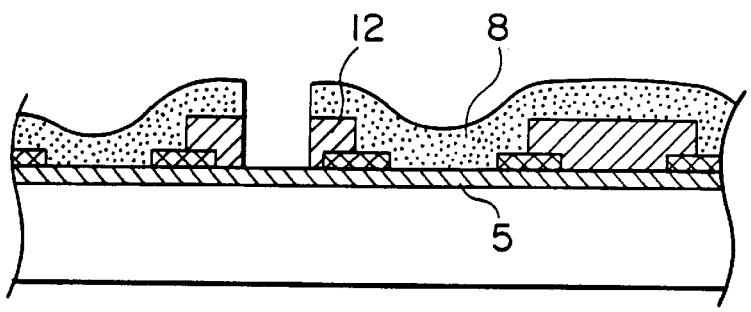
Figure 25D:
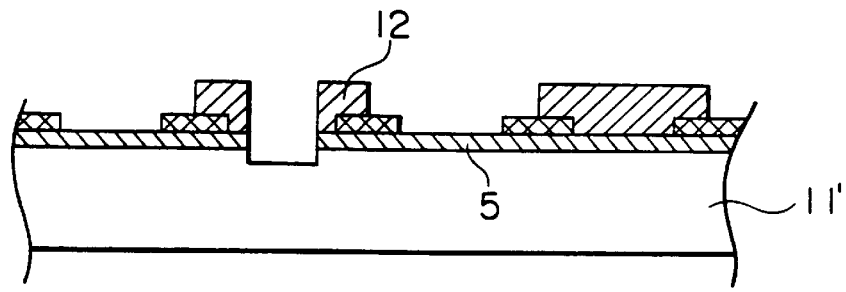
Figure 27:
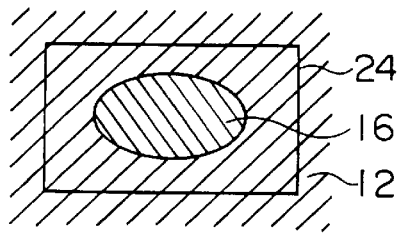
FIG. 27 is an enlarged plan view of a defective portion of a phase shifter corresponding to the step shown in FIG. 25B.

First, the substrate was spin-coated with a positive tone resist material OEBR-2000 (product name by Tokyo Ohka Kogyo Co.) of 1 $\mu$m thickness and an area of a 2 $\mu$m×3 $\mu$m rectangle 24 centering around the coordinate (−1258.3 $\mu$m, 5526.7 $\mu$m) was exposed by direct EB writing which uses an EB direct writing system. A plan view of the area 24 at this time is shown in FIG. 27. Though the OEBR-2000 was used as the resist material in the present embodiment, another resist material may be used. Also, a figure to be exposed is not limited to the above-mentioned method. Also, the area of the rectangle 24 may be exposed by use of light, radiation, charged particle beam, etc. Thereafter, a predetermined development process was conducted to form a rectangular opening portion 24 in the resist film 8. Thereafter, the silicon oxide film was selectively removed by an anisotropic dry etching process with the resist film 8 being used as a mask, as shown in FIG. 25C. Next, as shown in FIG. 25D, the silicon nitride film 5 and the synthetic quartz substrate 11' lying under the silicon oxide film were selectively removed by an anisotropic dry etching process.

Generally, the optimum value for the film thickness d of the phase shifter 12, that is, the film thickness providing a phase shift of 180° is determined by the equation $$d=\lambda/2(n-1),$$

as shown in conjunction with the embodiment 3. Here, $\lambda$ represents an exposure wave length and was 365 nm in the present embodiment and $\underline{n}$ represents the refractive index of the material (silicon oxide in the present embodiment) at the exposure wave length. Similarly, the thickness $\underline{d}$ of silicon nitride to be etched which is required to provide a phase shift of 180° is represented by the equation (1) and is about 177 nm according to the equation (1) by using the refractive index 2.03 of the silicon nitride film at the above wave length as $\underline{n}$. However, the thickness of the silicon nitride film 18 is 100 nm and is insufficient for the etching thickness. When this silicon nitride film is entirely etched, a phase shift of about 101.6° is introduced by the following calculation: ti 180°×(100/177)≈101.6°.

In order to provide the phase shift of 180°, a phase shift of 78.4° must be further introduced. Therefore, the synthetic quartz substrate 11' (silicon oxide) lying under the silicon nitride film 5 is thereafter etched by dry process. In order to introduce the phase shift of 180° by use of only silicon oxide, about 414.8 nm is given from the calculation $$365/2(1.44-1)\approx 414.8 \text{ nm}$$

by using n=1.44 and wave length $\lambda$=365 nm in the equation (1). In the present embodiment, the introduction of a phase shift of 78.4° suffices. Therefore, the etching depth of the synthetic quartz substrate 17 is about 181 nm from the following equation:

$$414.8\times(78.4/180)\approx 181 \text{ nm.}$$

Accordingly, the silicon nitride film 18 of 100 nm was first removed by etching by a dry process and the synthetic quartz substrate 17 was thereafter dry-etched selectively by a depth of 181 nm. Thereafter, the resist pattern 22 was removed so that the phase of light passed through an area where the phase shifter is formed and the phase of light passed through an area which was subjected to the above etching becomes the same (FIG. 25D).

A mask pattern was transferred by use of the thus defect-corrected phase shifting mask, with the result that the mask pattern can be transferred without yielding any abnormality even at a portion which corresponds to the above-mentioned phase shifter defect portion. The present embodiment has been shown in conjunction with the case where the silicon nitride film 5 is present as an etching stopper layer upon processing of the phase shifter film. However, the silicon nitride film may be omitted in the case where the ratio of the etching rate of the phase shifter film to that of the synthetic quartz substrate is sufficiently large. In this case, it is needless to say that the synthetic quartz substrate is etched in accordance with the equation (1).

In the present embodiment, a defect was corrected by forming a rectangle in an area including the defect. This method of effecting the defect correction after a phase shifter layer has been processed so that it can be easily shaped, is easy to handle in terms of a system as compared with a method of correcting the defect along the shape thereof. As a result, a time required for defect correction was short.

Though the optimum thickness $\underline{d}$ to be subjected to etching is represented by the equation (1), an effect is appreciable if d falls within a range of $\lambda/4(n-1)$ to $3\lambda/4(n-1)$.

Embodiment 9

A ninth embodiment will be explained by use of FIGS. 28, 29A, 29B and 29C. FIG. 29A is a view showing the structure of the cross section of a mask and FIG. 28 is a plan view of a defect portion. The phase shifting mask used has the same cross-sectional structure as the mask in the embodiment 8. As the result of mask defect inspection, there was found out a defect 16 in phase shifter 12, as shown in FIGS. 28 and 29A, which substantially centers around a position of coordinate (−132.8 μm, 869.4 μm) when the center of the mask is taken as the origin and the x-axis and the y-axis are perpendicularly provided in directions parallel to respective sides. The shape of the defect 16 was substantially an ellipse and the size thereof was in an extent which is sufficiently included in a rectangle of 6 μm in the x-direction and 3 μm in the y-direction.

Next, a phase shifter defect correction process will be explained by use of FIGS. 29A, 29B and 29C. The substrate 11' shown in FIG. 29A was spin-coated with a negative tone resist material RD-2000 (product name by Hitachi Chemical Co., Ltd.). A desired thickness for a phase shifter film is 260 nm in terms of a wave length=365 nm and a refractive index n=1.7 at that wave length. In the present example, the coat film thickness was selected to 310 nm since development and baking processes cause a decrease in film thickness by about 50 nm in all. However, the coat film thickness is not necessarily limited to the shown value. Thereafter, a rectangle of 6 μm×3 μm centering around the coordinate (−132.8 μm, 869.4 μm) was exposed by direct EB writing which uses an EB direct writing system. Though the RD-2000 (product name by Hitachi Chemical Co., Ltd.) was used in the present embodiment, another resist material may be used. But, the optimum film thickness changes depending upon the refractive index of a resist material used. Thereafter, a predetermined development process was conducted to form a resist film 8 in the defect portion 16, as shown in FIG. 29B. It is preferable that the resist film 8 is formed with an area slightly smaller than the defect 16 of the phase shifter 12. It is possible to prevent the resist film 8 and the phase shifter 12 from overlapping each other due to a manufactural error. A gap between the resist film 8 and the phase shifter 12 will be filled up through the subsequent thermal flow process.

The mask was baked at a temperature of 140° for 30 minutes to cause thermal flow of the resist film 8, as shown in FIG. 29C. A mask pattern was transferred by use of the thus defect-corrected phase shifting mask, with the result that the mask pattern can be transferred without yielding any abnormality even at a portion which corresponds to the above-mentioned phase shifter defect portion.

Embodiment 10

A tenth embodiment will be explained by use of FIGS. 30A to 30D.

Figure 30A:
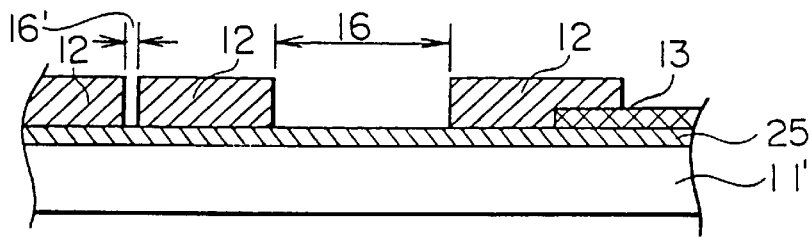

A phase shifting mask for KrF excimer laser 5:1 reduction projection aligner was fabricated and the mask was inspected by use of a mask pattern defect inspection system. The structure of the cross section of the phase shifting mask used in the present embodiment has a structure, as shown in FIG. 30A, in which a magnesium fluoride film 25 (20 nm) and a silicon oxide film (248 nm thickness) as a phase shifter 12 are laminated on a synthetic quartz substrate 11' in an area where the phase shifter is formed. As the result of inspection, there was found out a phase shifter deficiency defect 16 which substantially centers around a position of coordinate (−2010.1 μm, −2001.2 μm) when the center of the mask is taken as the origin and the x-axis and the y-axis are perpendicularly provided in directions parallel to respective sides. The shape of the defect 16 was substantially an ellipse and the size thereof was in an extent which is sufficiently included in a rectangle of 3 μm in the x-direction and 5 μm in the y-direction. Also, there was found out a second defect 16' which substantially centers around a position of coordinate (2061.5 μm, 1988.7 μm). The size of the second defect 16' was in an extent which is sufficiently included in a rectangle of 0.2 μm in the x-direction and 0.3 μm in the y-direction. Since the size of the second defect was smaller than the resolution limit, this defect was not subjected to correction based on steps which will be mentioned hereinbelow.

Figure 30B:
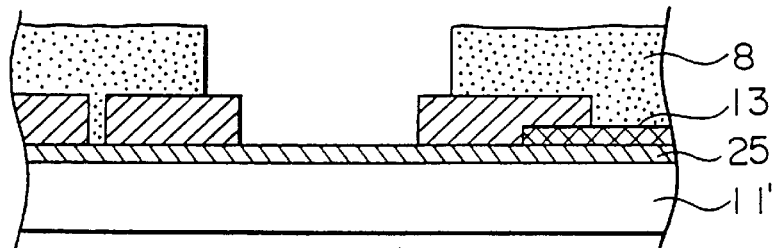
Figure 30C:
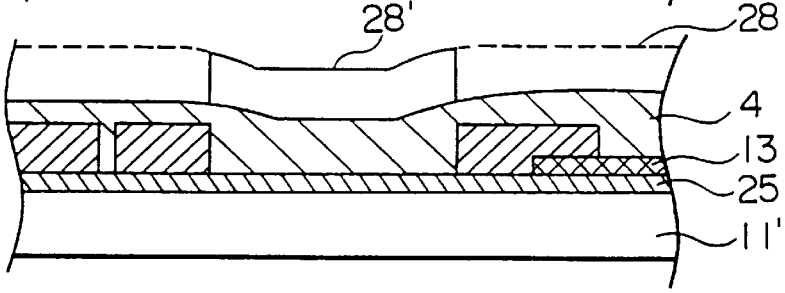
Figure 30D:
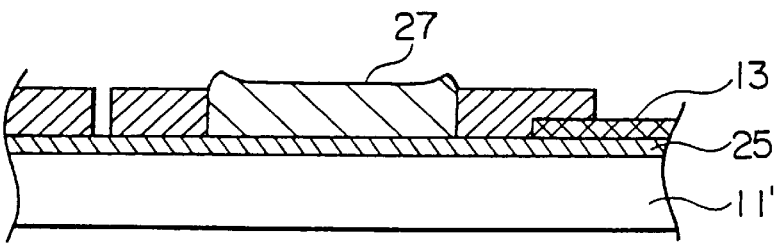
Figure 31:
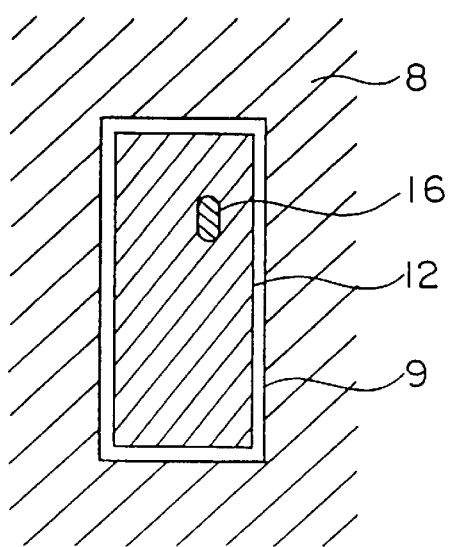
FIG. 31 is a plan view of a phase shifter having a defect.

First, the substrate was coated with a positive tone resist material OEBR-2000 (product name by Tokyo Ohka Kogyo Co.) of 1 μm thickness and a rectangle of 3 μm×5 μm centering around the coordinate (−2010.1 μm, −2001.2 μm) was exposed by direct EB writing which uses an EB direct writing system. Though the OEBR-2000 was used in the present embodiment, another resist material may be used. Also, exposure means and method are not limited to those disclosed here. Thereafter, a predetermined resist development process was conducted to form a resist film 8 having an opening portion which exposes the defect portion 16, as shown in FIG. 30B. Next, the silicon oxide film as the phase shifter 12 was selectively removed by anisotoropic etching by a process with the resist film 8 being used as a mask. Next, the substrate was coated with an SOG (spin on glass) material film 4, as shown in FIG. 30C. The thickness of the SOG film 4 was selected to 248 nm by substituting λ by 248 nm and n by the refractive index 1.5 of the SOG film at that wave length in the equation (1). However, the film thickness is not limited to the shown value. Thereafter, the substrate was coated with a negative tone resist material 8 (RD-2000, product name by Hitachi Chemical Co., Ltd.) of 1 μm thickness and a rectangle of 3 μm×5 μm centering around the coordinate (−2010.1 μm, −2001.2 μm) was exposed by direct EB writing which uses the EB direct writing system. Though the RD-2000 (product name by Hitachi Chemical Co., Ltd.) was used in the present embodiment, another resist material may be used. Thereafter, a predetermined resist development process was conducted to form a resist film 8'. Next, as shown in FIG. 30D, the SOG film 4 was selectively removed by etching by a dry process and the resist film 8' was thereafter removed. A mask pattern was transferred by use of the thus defect-corrected phase shifting mask, with the result that the mask pattern can be transferred without yielding any abnormality even at portions which correspond to the above-mentioned phase shifter defect portions.

Though the optimum value for the thickness $\underline{d}$ of the SOG film is represented by the equation (1), an effect is appreciable if $\underline{d}$ falls within a range of $\lambda/4(n-1)$ to $3\lambda/4(n-1)$ where λ represents an exposure wave length and n represents the refractive index of the material at that exposure wave length.

Embodiment 11

Another phase shifting mask defect correcting method similar to the eleventh embodiment will be mentioned. As the result of mask defect inspection, there was found out a phase shifter deficiency defect 16 which substantially centers around a position of coordinate (2001.6 μm, −2010.8 μm) when the center of a mask is taken as the origin and the x-axis and the y-axis are perpendicularly provided in directions parallel to respective sides. The shape of the defect was substantially a rectangle and the size thereof was about 1 μm in the x-direction and about 1.5 μm in the y-direction. Also, the shape of a phase shifter 12 including the defect therein was a rectangle of 2.0 μm in the x-direction and 10.0 μm in the y-direction centering around the coordinate (2001.1 μm, −2008.8 μm).

Next, the substrate was coated with a positive tone resist film 8. And, a rectangular opening portion 9 of 2.3 μm×10.3

μm which centers around the coordinate (−2001.1 μm, −2008.8 μm) and is larger than the phase shifter 12 by 0.3 μm in each of the x- and y-directions, was formed by a known process. Thereafter, the phase shifter pattern was selectively removed by a dry etching process with the resist film with the opening portion 9 being used as a mask. Next, the resist pattern was removed and the substrate was thereafter spin-coated with an SOG (spin on glass) material film. The thickness of the SOG film was selected to 248 nm by substituting λ by 248 nm and $\underline{n}$ by the refractive index 1.5 of the SOG film at that wave length in the equation (1). However, the film thickness is not limited to the shown value. The substrate was coated with a negative tone resist film and a rectangular pattern of 2.0 μm×10.0 μm centering around the coordinate (−2001.1 μm, −2008.8 μm) was formed by known exposure and development processes. Thereafter, the SOG film was selectively etched away with the resist pattern being used as a mask and the resist pattern was removed. A mask pattern was transferred by use of the thus defect-corrected phase shifting mask, with the result that the mask pattern can be transferred without yielding any abnormality even at a portion which corresponds to the above-mentioned phase shifter defect portion.

Embodiment 12

Figure 32:
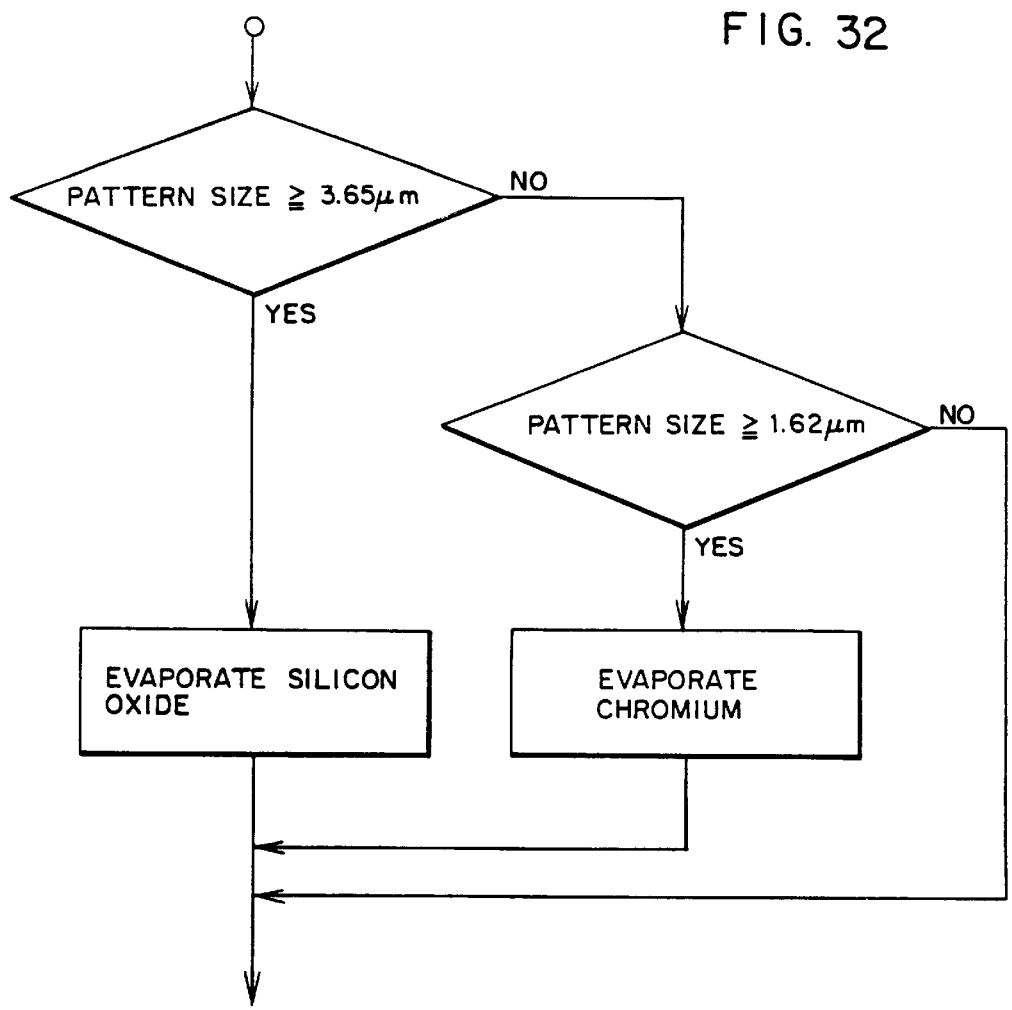
FIG. 32 is a flow chart showing a method for correction of a defect in a phase shifter.

A phase shifting mask for i-line 10:1 reduction projection aligner having a numerical aperture NA of 0.45 was fabricated and the mask was inspected using a mask pattern defect inspection/correction system. The structure of the cross section of the phase shifting mask used in the present embodiment has a structure in which a silicon nitride film (100 nm thickness) and a silicon oxide film (388 nm thickness) are laminated on a synthetic quartz substrate in an area where a phase shifter is formed. First, a method of correcting a defect in the phase shifter will be explained by use of FIG. 32. When a deficiency exists as the defect in the phase shifter and the maximum dimension thereof is not smaller than the resolution limit of a light shielding pattern or not smaller than the value of the equation $$k\lambda/NA \times 10 = 3.65 \ \mu m \qquad (2)$$

where $\underline{k}$ is 0.45 and λ represents an exposure wave length (i-line), the defect portion is corrected by vapor deposition of silicon oxide. In this case, the silicon oxide was vapor-deposited with a predetermined thickness with which exposure light passed through the area where the phase shifter is formed and exposure light passed through an area after the defect has been corrected becomes the same in phase.

On the other hand, when the maximum dimension of the defect is smaller than 3.65 μm and is not smaller than the resolution limit of the phase shifter or not smaller than the value of the equation $$k\lambda/NA \times 10 = 1.62 \ \mu m \qquad (3)$$

where $\underline{k}$ is 0.2, a chromium film is vapor-deposited at the defect portion.

When the maximum dimension of the defect is smaller than 1.62 μm, correction for the phase shifter defect is not made since the defect is not transferred. The value of $\underline{k}$, the resolution limit of the light shielding pattern, the resolution limit of the phase shifter, etc. change depending upon a projection exposure system, etc.

Figure 33:
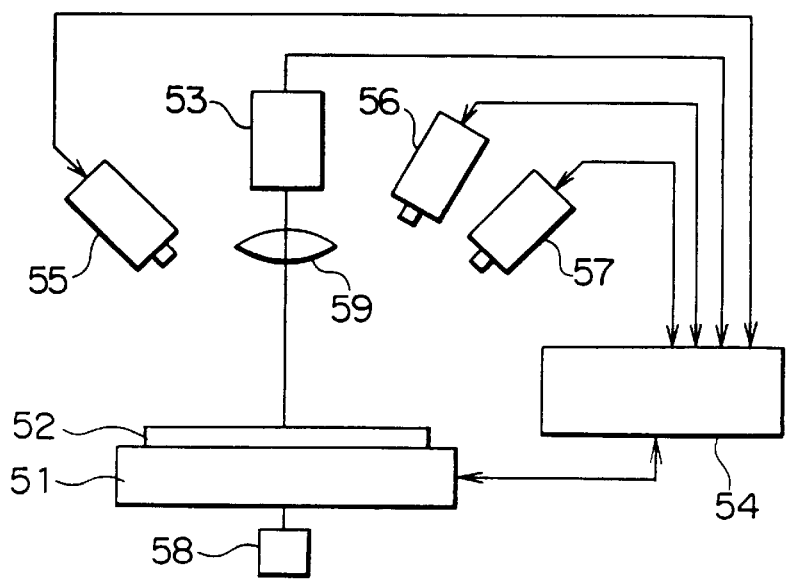
FIG. 33 is a schematic diagram of an apparatus for correcting a defect in a phase shifter.

Next, steps of performing the inspection and correction of the mask in accordance with the above-mentioned method will be explained by use of FIG. 33. The inspection of a mask 52 was made by placing the mask 52 on an XY stage 51, detecting light from a light source 58 passed through the mask 52 by a light detecting section 53 through a lens 59 while moving the XY stage 51 by a controller 54, and making comparison with a pattern stored in the controller 54. There was detected a phase shifter deficiency defect which substantially centers around the coordinate (1368.9 μm, −1380.9 μm) when the center of the mask is taken as the origin and the x-axis and the y-axis are perpendicularly provided in directions parallel to respective sides. The shape of the defect was substantially a circle and the size thereof was about 4.2 μm in diameter. Since the size of the defect was larger than 3.65 μm, the mask was exposed around the above coordinate (1368.9 μm, −1380.9 μm) to a beam of silicon oxide vapor of 4.2 μm diameter by a variable shaped aperture silicon oxide evaporation system 55 to vapor-deposit a silicon oxide film of 390 nm thickness.

Thereafter, the inspection of the mask was made again and there was detected a second phase shifter deficiency defect which substantially centers around the coordinate (1368.9 μm, 370.9 μm). The shape of this defect was substantially a rectangle and the size thereof was about 1.0 μm in the x-direction and 2.3 μm in the y-direction. Since the size of the defect was smaller than 3.65 μm and larger than 1.62 μm, a chromium film is to be vapor-deposited on the defect area. Therefore, the mask was exposed around the coordinate (1368.9 μm, 370.9 μm) to chromium vapor in a rectangular form of 1 μm in longitudinal dimension and 2.3 μm in lateral dimension by a variable shaped aperture chromium evaporation system 56 to vapor-deposit a chromium film.

Thereafter, the mask was inspected again and there was detected a third phase shifter deficiency defect which substantially centers around the coordinate (1368.9 μm, 450.6 μm). The shape of this defect was substantially a rectangle and the size thereof was about 0.5 μm in the x-direction and about 0.8 μm in the y-direction. Since the size of the defect was smaller than 1.62 μm, no correction was made for the defect.

Thereafter, the mask was inspected again and there was detected a chromium pattern deficiency defect which substantially centers around the coordinate (1368.9 μm, 468.6 μm). This defect was a triangular deficiency with 1 μm as the length of one side at an end of the line-shaped chromium pattern of 4 μm width. Therefore, a chromium film was vapor-deposited by the variable shaped aperture evaporation system 56 with a chromium vapor beam being shaped into a square of 2 μm×2 μm so that the chromium pattern takes a line form of 4 μm width.

Thereafter, the mask was inspected again and there was detected a phase shifter residue defect which substantially centers around the coordinate (1368.9 μm, 501.8 μm). This defect was a circle of about 0.6 μm diameter. Since the size of the defect was not larger than the resolution limit, no correction was made for the defect.

Thereafter, the mask was inspected again and there was detected a phase shifter residue defect which substantially centers around the coordinate (−258.1 μm, 358.6 μm). The shape of this defect was substantially a circle and the size thereof was about 3.7 μm in diameter. Therefore, the mask was exposed around the above coordinate to a focused ion beam of 3.7 μm diameter by a focused ion beam system 57 to remove the phase shifter residue.

Thereafter, the mask was inspected again and no defect was detected in another area on the mask.

A mask pattern was transferred by use of the thus defect-corrected phase shifting mask, with the result that the mask pattern can be transferred without yielding any abnormality even at portions which correspond to the above-mentioned phase shifter defect portions.

Embodiment 13

A phase shifting mask was fabricated using a mask plate substrate having a structure similar to that shown in FIGS. 23A and 23B. But, transparent antistatic films (ITO (indium tin oxide)) were used in place of the silicon nitride films 5 and 5'. The transparent antistatic films of the mask plate substrate and the chromium film for forming a light shielding pattern were brought into contact with each other at a peripheral portion of the mask plate substrate and a phase shifter pattern was formed by a lithographic process using a radio-chemically sensitive material with these films being electrically grounded. If upon EB exposure by an EB direct writing system the exposed portion is not electrically grounded, the irradiated portion is charged up to cause the occurrence of a positional deviation of the pattern. In the present embodiment, such a positional deviation was not observed.

The transparent antistatic film may be substituted for only one of the silicon nitride films 5 and 5'. Further, in the case where the etching rate of the silicon oxide film 12 is sufficiently rapid for the silicon oxide film 14, the silicon nitride film 5' may be omitted.

Embodiment 14

Figure 35:
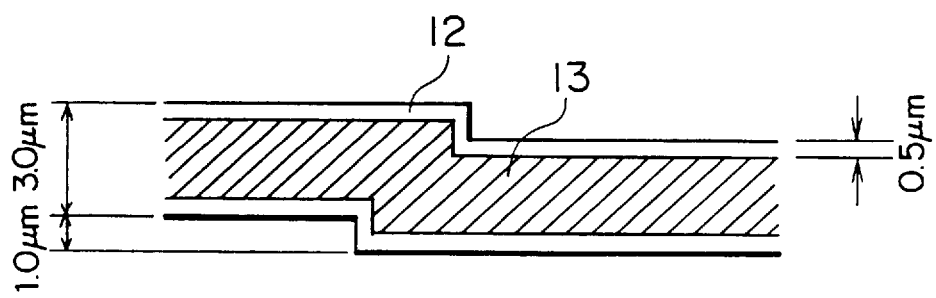
FIG. 35 is a schematic plan view of a phase shifting mask.

The transfer of an isolated wire pattern as shown in FIG. 35 was made using a KrF excimer laser stepper (wave length 248 nm) having an optical projection system the NA of which is 0.35.

Figure 34:
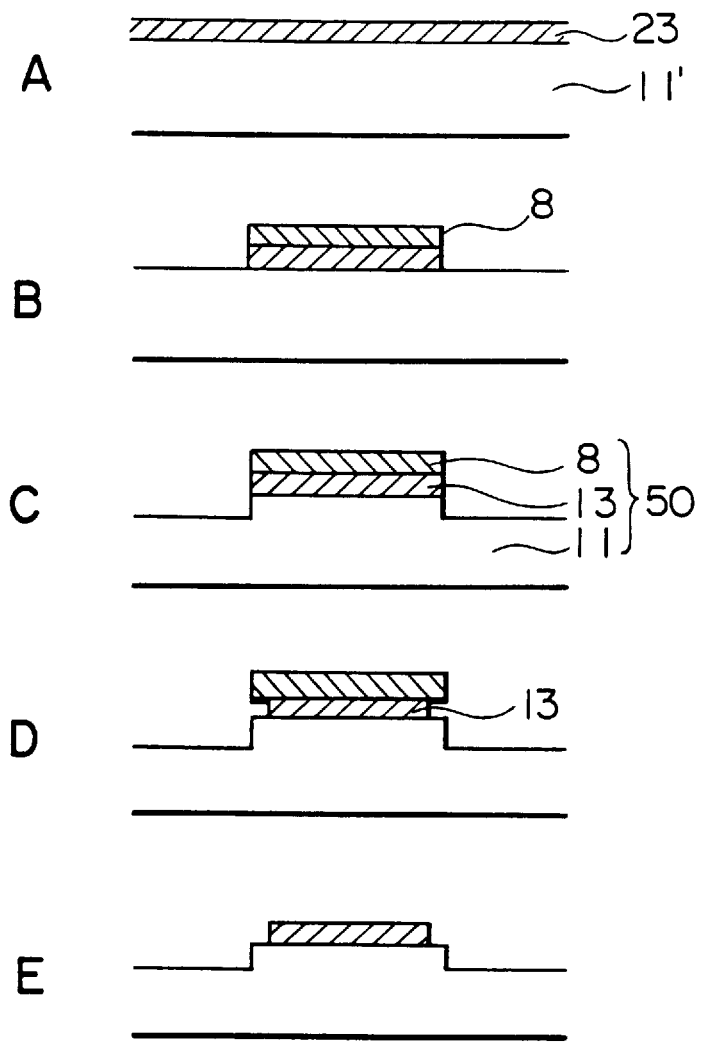
FIG. 34 are schematic cross sections showing steps for manufacture of a phase shifting mask.

A process for fabrication of this mask will be explained by use of FIG. 34. First, there was prepared a synthetic quartz substrate 11' on which a chromium film 23 of 80 nm thickness is successively laminated (A in FIG. 34). The chromium film 23 is used as an opaque film. The substrate was coated with a negative tone resist material RD2000N (product name by Hitachi Chemical Co., Ltd.) and a predetermined light shielding pattern area was exposed using an EB direct writing system. Though the RD2000N (product name by Hitachi Chemical Co., Ltd.) was used in the present embodiment, another resist material may be used. After the exposure, a predetermined resist development process was conducted to form a resist film 8 having a desired configuration. Thereafter, the resist film 8 was used as a mask so that the chromium film 23 is etched by wet process using a predetermined etchant to form a light shielding portion 13 (B in FIG. 34). Next, the synthetic quartz substrate 11' was etched by wet process using an etchant containing hydrofluoric acid diluted to 1/60 with ammonium fluoride, thereby forming a lamination portion 50 which includes three layers of the resist film 8, the light shielding portion 13 and the synthetic quartz substrate 11' (C in FIG. 34). In the present embodiment, since the synthetic quartz substrate 11' is used as a phase shifter, the etching depth of the synthetic quartz substrate 11' was selected to 260 nm by using $\lambda$=248 nm and n=1.48 in the equation (1) mentioned in conjunction with the embodiment 3. Since the etching rate of the synthetic quartz substrate 11' for the above etchant is 20 nm/sec, the etching time was selected to about 1300 seconds. Next, the chromium film was again etched by wet process using a predetermined etchant (D in FIG. 34). In order that the synthetic quartz substrate delineated into a width of 0.5 $\mu$m is exposed at an outline portion of the light shielding portion 13, the etching was made for about 20 seconds in light of the etching rate 25 nm/sec of the chromium film. Thereafter, the resist film 8 was removed to obtain a desired phase shifting mask (E in FIG. 34).

The phase shift mask fabricating method is not limited to the foregoing. Another known method may be employed.

The mask pattern of the thus fabricated phase shifting mask was transferred by use of the above-mentioned stepper onto a chemically amplified negative tone resist material SAL-601 (product name by Shipley Co.) with which a silicon substrate is coated. For comparison, the transfer of the same pattern was made using the conventional type mask. Though the value of coherency was 0.3 in the present embodiment, another value may be used. Also, though the chemically amplified negative tone resist material SAL-601 (product name by Shipley Co.) was used in the present embodiment, another resist material may be used. After the pattern was exposed under a predetermined exposure condition, predetermined post exposure baking and development processes were conducted to form a resist pattern.

The formed resist pattern was observed by a scanning electron microscope (SEM). As a result, it was confirmed that the case using the mask according to the present invention can form a pattern having a cross-sectional form which is more perpendicular as compared with the case using the conventional type mask. Also, the depth of focus of about ±1 $\mu$m centering around an in-focus level was obtained.

It is further understood by those skilled in the art that the foregoing description is a preferred embodiment of the disclosed device and that various changes and modifications may be made in the invention without departing from the spirit and scope thereof.

What is claimed is:

1. A method of manufacturing a mask, comprising:
   a step of forming a light shielding film with a predetermined configuration on a substrate which is substantially transparent to exposure light; and
   a step of forming a phase shifter at a side wall of said light shielding film.

2. A method of forming a pattern, comprising:
   a step of forming a resist film on a substrate; and
   a step of exposing said resist film by use of a mask manufactured by a method of manufacturing a mask according to claim 1.

3. A method of manufacturing a mask, comprising:
   a step of forming a phase shifter with a desired configuration on a substrate which is substantially transparent to exposure light; and
   a step of correcting a defect in said phase shifter after said step of forming said phase shifter, wherein said step of correcting the defect in said phase shifter includes a step of removing a desired area of said phase shifter including a defect portion, and a step of forming a transparent film in said area so that the exposure light passed through said phase shifter and the exposure light passed through the area where said transparent film is formed become substantially the same in phase of wave length $\lambda$.

4. A method of manufacturing a mask according to claim 3, wherein the thickness of said transparent material film falls within a range of $\lambda/(4(n-1))$ to $(3\lambda)/(4(n-1))$ where n represents the refractive index of said transparent material at the wave length $\lambda$.

5. A method of manufacturing a mask according to claim 3, wherein said step of correcting the defect in said phase shifter includes a step of removing a portion of said phase shifter formed in an area other than a predetermined pattern area by use of a particle beam.

6. A method of manufacturing a masks comprising:
   a step of forming a phase shifter with a desired configuration on a substrate which is substantially transparent to exposure light; and
   a step of correcting a defect in said phase shifter after said step of forming said phase shifter, wherein said step of correcting the defect in said phase shifter includes a step of removing a desired area of said phase shifter including a defect portion, and a step of removing a material lying under the phase shifter of said area so that the exposure light passed through said phase shifter and the exposure light passed through the area where said phase shifter is removed become substantially the same in phase of wave length $\lambda$.

7. A method of manufacturing a mask according to claim 6, wherein the thickness of said transparent material film falls within a range of $\lambda/(4(n-1))$ to $(3\lambda)/(4(4(n-1))$ where $\underline{n}$ represents the refractive index of said transparent material at the wave length $\lambda$.

8. A method of manufacturing a mask according to claim 6, wherein said step of correcting the defect in said phase shifter includes a step of removing a portion of said phase shifter formed in an area other than a predetermined pattern area by use of laser light.

9. A method of manufacturing a masks comprising:

a step of forming a phase shifter with a desired configuration on a substrate which is substantially transparent to exposure light; and a step of correcting a defect in said phase shifter after said step of forming said phase shifter, wherein said step of correcting the defect in said phase shifter includes a step of forming a transparent material film in a defect portion, and a step of processing said transparent material film so that the exposure light passed through said phase shifter and the exposure light passed through said transparent material film become substantially the same in phase of wave length $\lambda$.

10. A method of manufacturing a mask according to claim 9, wherein the thickness of said transparent material film falls within a range of $\lambda/(4(n-1))$ to $(3\lambda)/(4(4(n-1)))$ where n represents the refractive index of said transparent material at the wave length $\lambda$.

11. A method of manufacturing a mask according to claim 9, wherein the transparent material includes a photosensitive material.

12. A method of manufacturing a mask according to claim 11, wherein the processing of said transparent material film includes a step for exposure to light and development.

13. A method of manufacturing a mask according to claim 9, wherein the transparent material includes a radiosensitive material.

14. A method of manufacturing a mask according to claim 13, wherein the processing of said transparent material film includes a step for exposure to a charged particle beam and development.

15. A method of manufacturing a mask according to claim 9, wherein the processing of said transparent material film includes a step of heating said transparent material film to cause thermal flow thereof.

16. A method of forming a pattern, comprising:

a step of forming a resist film on a substrate; and a step of exposing said resist film by use of a mask manufactured by a method of manufacturing a mask according to claim 9.

17. A method of forming a pattern, comprising:

a step of coating a substrate with a spin on glass film which includes a silanol compound; and a step of forming a desired pattern in said spin on glass film by direct exposure using laser light.

18. A method of forming a pattern, comprising:

a step of coating a substrate with a spin on glass film which includes a silanol compound; and a step of forming a desired pattern in said spin on glass film by direct exposure using a charged particle beam.

* * * * *